(12) United States Patent
Bok et al.

(10) Patent No.: US 11,950,483 B2
(45) Date of Patent: Apr. 2, 2024

(54) DISPLAY DEVICE

(71) Applicant: Samsung Display Co., Ltd., Yongin-Si (KR)

(72) Inventors: Seung-Lyong Bok, Hwaseong-si (KR); Jae-Kyoung Kim, Hwaseong-si (KR); Chang Sik Kim, Seongnam-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/678,889

(22) Filed: Feb. 23, 2022

(65) Prior Publication Data

US 2022/0399406 A1 Dec. 15, 2022

(30) Foreign Application Priority Data

Jun. 10, 2021 (KR) ........................ 10-2021-0075691

(51) Int. Cl.
| | |
|---|---|
| *H10K 50/822* | (2023.01) |
| *G06F 1/16* | (2006.01) |
| *G06F 3/044* | (2006.01) |
| *H10K 59/40* | (2023.01) |
| *H10K 59/131* | (2023.01) |
| *H10K 102/00* | (2023.01) |

(52) U.S. Cl.
CPC ........... *H10K 59/40* (2023.02); *G06F 3/0443* (2019.05); *H10K 50/822* (2023.02); *G06F 3/0446* (2019.05); *G06F 2203/04102* (2013.01); *G06F 2203/04111* (2013.01); *H10K 59/131* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| D895,639 S | 9/2020 | Alonso Ruiz et al. | |
| 11,038,264 B2 | 6/2021 | Son et al. | |
| 2006/0044300 A1* | 3/2006 | Koyama | G09G 3/30 |
| | | | 345/207 |
| 2015/0097755 A1* | 4/2015 | Kim | G06F 3/1446 |
| | | | 345/1.3 |

(Continued)

FOREIGN PATENT DOCUMENTS

| | | | | |
|---|---|---|---|---|
| CN | 109375822 A | * | 2/2019 | ........... G06F 3/0412 |
| KR | 10-1818970 B1 | | 1/2018 | |

(Continued)

OTHER PUBLICATIONS

Senglee Foo, Wen Tong, "AMOLED In-Display Antennas", 14th European Conference on Antennas and Propagation (EuCAP), Mar. 2020, 5 pages, IEEE, Copenhagen, Denmark.

*Primary Examiner* — Duane N Taylor, Jr.

(74) *Attorney, Agent, or Firm* — Innovation Counsel LLP

(57) ABSTRACT

An embodiments may be related to a display device. A display device may include display layer and an antenna. The display layer may comprise a first display area including an exposed area and a cover area, a folding display area adjacent to the first display area, and a second display area adjacent to the folding area. The antenna disposed on the exposed area of the first display area, wherein the second display area covers the cover area of the first display area and exposes the exposed area of the first display area, when the folding display area is folded.

9 Claims, 22 Drawing Sheets

(56) References Cited

U.S. PATENT DOCUMENTS

| | | | | |
|---|---|---|---|---|
| 2016/0147263 A1* | 5/2016 | Choi | ............... | G06F 1/1652 |
| | | | | 361/679.3 |
| 2018/0026341 A1* | 1/2018 | Mow | ............... | H01Q 21/065 |
| | | | | 343/702 |
| 2018/0136837 A1* | 5/2018 | Curchod | ............... | G06F 3/0236 |
| 2019/0103656 A1* | 4/2019 | Shi | ............... | G06F 1/1683 |
| 2020/0194676 A1 | 6/2020 | Chang et al. | | |
| 2020/0201470 A1 | 6/2020 | Oh et al. | | |
| 2020/0329132 A1 | 10/2020 | Jung et al. | | |
| 2020/0393936 A1 | 12/2020 | Bok et al. | | |
| 2020/0411957 A1* | 12/2020 | Zhu | ............... | H01Q 9/42 |
| 2021/0336356 A1* | 10/2021 | Choi | ............... | G06F 1/1698 |
| 2022/0200132 A1* | 6/2022 | Oh | ............... | H01Q 9/0407 |
| 2022/0231097 A1* | 7/2022 | Wang | ............... | H01Q 1/22 |

FOREIGN PATENT DOCUMENTS

| | | | |
|---|---|---|---|
| KR | 10-2020-0008408 A | 1/2020 | |
| KR | 10-2020-0119003 A | 10/2020 | |
| KR | 10-2020-0143628 A | 12/2020 | |
| KR | 10-2190757 B1 | 12/2020 | |
| WO | WO-0173673 A2 * | 10/2001 | ............ G06F 1/162 |
| WO | WO-2022073600 A1 * | 4/2022 | |

\* cited by examiner

DISPLAY DEVICE

CROSS-REFERENCE TO RELATED APPLICATION

This U.S. non-provisional patent application claims priority under 35 U.S.C. § 119 to Korean Patent Application No. 10-2021-0075691, filed on Jun. 10, 2021; the Korean Patent Application is incorporated by reference.

BACKGROUND

1. Field

The technical field relates to a display device including an antenna.

2. Description of the Related Art

A display device may display images in response to input signals. A flexible display device may include a flexible display panel that is foldable. When the flexible display device is folded, the footprint of the flexible display device may be significantly reduced, such that the flexible display device may be more portable and/or more capable of fitting into a limited space.

SUMMARY

Embodiments may be related to a display device including an antenna with satisfactory transmission and reception.

Embodiments may be related to a display device capable of communicating in various frequency bands.

An embodiments may be related to a display device. A display device may include display layer and an antenna. The display layer may comprise a first display area including an exposed area and a cover area, a folding display area adjacent to the first display area, and a second display area adjacent to the folding area. The antenna disposed on the exposed area of the first display area, wherein the second display area covers the cover area of the first display area and exposes the exposed area of the first display area, when the folding display area is folded.

The display device further includes a sensor layer disposed on the display layer. The sensor layer includes a first conductive layer disposed on the display layer, an insulating layer disposed on the first conductive layer, and a second conductive layer disposed on the insulating layer, and the antenna includes an antenna pattern disposed on the same layer as the second conductive layer.

The antenna further includes a ground pattern disposed on the same layer as the first conductive layer and grounded, and the ground pattern has a size greater than a size of the antenna pattern.

The second conductive layer of the sensor layer includes an auxiliary pattern disposed adjacent to the antenna pattern and configured to sense an external input.

The display layer includes a first electrode, a light emitting layer disposed on the first electrode, and a second electrode disposed on the light emitting layer, and spaced from the antenna pattern in a plan view of the display device.

The second electrode includes an opening, wherein the antenna pattern is least partially disposed inside the opening in the plan view of the display device. The display device further includes a sensor layer disposed on the display layer. The sensor layer includes a first conductive layer disposed on the display layer, an insulating layer disposed on the first conductive layer, and a second conductive layer disposed on the insulating layer. The antenna includes an antenna pattern disposed on the sensor layer and a transmission line disposed on the same layer as the first conductive layer or the second conductive layer, and the antenna pattern is indirectly fed through the transmission line.

The display device further includes an optical film disposed between the display layer and the antenna, and a compensation film disposed between the optical film and the antenna.

The display device further includes a compensation film disposed between the display layer and the antenna, and an optical film disposed on the compensation film, wherein the antenna is disposed between the compensation film and the optical film.

The display device further includes a first circuit film electrically connected to each of the display layer and the antenna, and overlapping the display layer.

The display device further includes a first circuit film electrically connected to the display layer and overlapping the second display area, and a second circuit film electrically connected to the antenna and overlapping the first display area.

The antenna include a first sub-antenna and a second sub-antenna, wherein the first sub-antenna comprises a first antenna pattern and a first transmission line directly connected to each other, wherein the second sub-antenna comprises a second antenna pattern and a second transmission line directly connected to each other, and wherein the first transmission line and the second transmission line have the same length. The display device further includes an additional antenna, wherein each of the first display area and the second display area comprises a main display area and an auxiliary display surface bent from and extending from the main display area, and wherein the additional antenna is disposed on the auxiliary display surface.

The display device further includes a first additional antenna overlapping the cover area of the first display area and a second additional antenna overlapping the second display area.

The exposed area includes a first auxiliary display area, a second auxiliary display area, and a non-display area positioned between the first and second auxiliary display areas, and wherein the antenna overlaps at least one of the first auxiliary display area and the second auxiliary area.

The display device further includes an auxiliary display layer overlapping the second display area, wherein an image displaying direction of the second display area is opposite to an image displaying direction of the auxiliary display layer.

The display layer includes a main display area, a first auxiliary display area, and a second auxiliary display area protruded from the main display area, a width in a first direction of the main display area is greater than a width in the first direction of the first and second auxiliary display areas, and the exposed area includes a portion of the main display area and the first and second auxiliary display areas.

Each of the first and second auxiliary display areas includes a first area and a second area, and wherein an image display resolution of the second area is higher than a resolution of the first area.

The antenna overlaps the second area.

The first display area is longer than the second display area in a direction perpendicular to a folding axis of the display device.

According embodiments, a display device may be bent/folded with respect to a folding axis to make a second non-folding area partially overlap a first non-folding area.

An antenna is disposed in the exposed area of the first non-folding area that is not covered by the second non-folding area when the display device is folded. Therefore, the antenna is not covered by a case or a housing of the display device. Thus, the antenna may effectively receive and transmit signals, such as high frequency signals used for 5G mobile communications.

DETAILED DESCRIPTION

Figure 1:
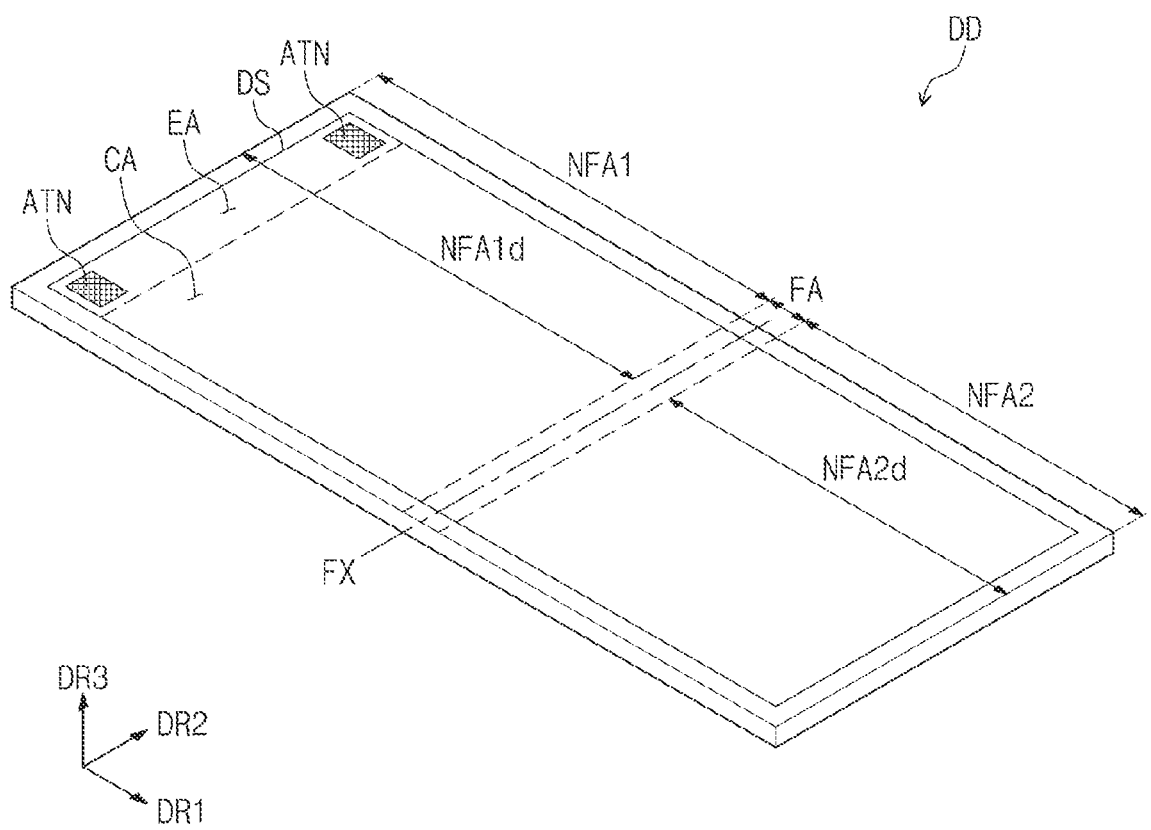
FIG. 1 is a perspective view showing a display device according to an embodiment.

Examples of embodiments are described with reference to the accompanying drawings.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on," "connected to," or "coupled to" a second element, the first element can be directly or indirectly on, connected to, or coupled to the second element.

Like numerals may refer to like elements. In the drawings, dimensions of components may be exaggerated for effective description.

The singular forms indicated by "a", "an," and "the" may represent the plural forms as well, unless the context clearly indicates otherwise.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" or "comprise" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The term "defined" may mean "positioned," "arranged," "formed," or "provided." The expression that a space or opening overlaps an object may mean that (the position of) the space or opening overlaps with (the position of) the object. The term "area" may mean "section," "portion," or "part." The term "be" may mean "include/be."

FIG. 1 is a perspective view showing a display device DD according to an embodiment.

Referring to FIG. 1, the display device DD may include a display surface DS extending in a first direction DR1 and in a second direction DR2 different from the first direction DR1. The display device DD may display an image IM (refer to FIG. 7) to a user through the display surface DS.

A thickness direction of the display device DD may be perpendicular to each of the first direction DR1 and the second direction DR2 and may be in a third direction DR3. A plan view of the display device DD may be viewed in the third direction DR3.

The display device DD may include a folding (display) area FA and non-folding (display) areas NFA1 and NFA2. The folding area FA may include, overlap, and/or correspond to a folding structure/mechanism (e.g., a hinge) and may be referred to as a foldable area. The non-folding areas NFA1 and NFA2 may include, overlap, and/or correspond to rigid support structures/members/plates and may be referred to as non-foldable areas. The areas FA, NFA1, and NFA2 may all include pixels and may respectively display different portions of a same image in response to a set of input signals when the display device DD is not folded.

The non-folding areas NFA1 and NFA2 may include a first non-folding area NFA1 (or first display area NFA1) and a second non-folding area NFA2 (or second display area NFA2). The folding area FA (or folding display area FA) may be connected between the first non-folding area NFA1 and the second non-folding area NFA2 and/or may connect the first non-folding area NFA1 and the second non-folding area NFA2. The folding area FA may be adjacent to the first non-folding area NFA1, and the second non-folding area NFA2 may be adjacent to the folding area FA. The first non-folding area NFA1, the folding area FA, and the second non-folding area NFA2 may be sequentially arranged in the display device DD in the first direction DR1 when the display device DD is not folded. The first non-folding area NFA1 may have a length NFA1$d$ greater than a length NFA2$d$ of the second non-folding area NFA2 in the first direction DR1.

Figure 2A:
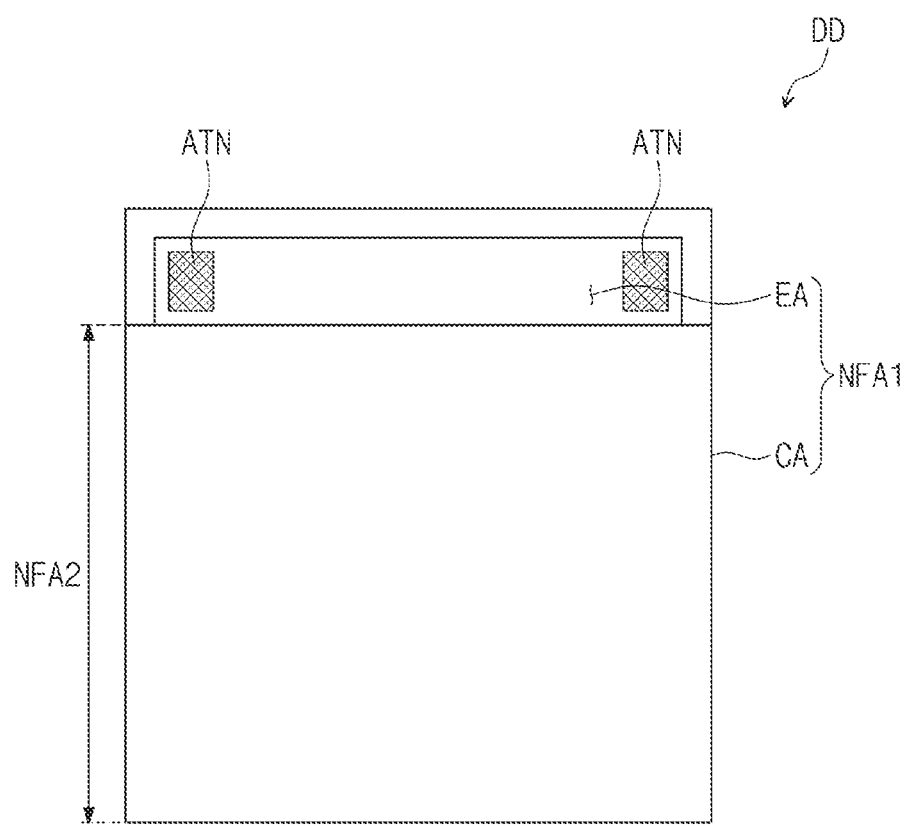
FIG. 2A is a plan view showing a folded display device according to an embodiment.
Figure 2A:
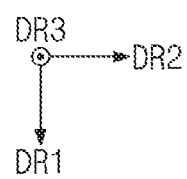
Figure 2B:
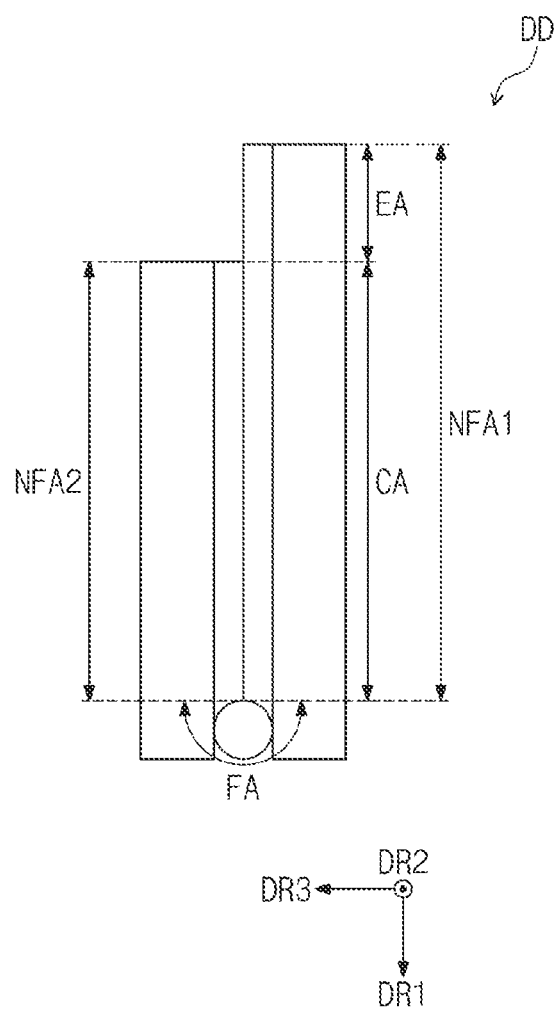
FIG. 2B is a side view showing the folded display device shown in FIG. 2A according to an embodiment.

FIG. 2A is a plan view showing a folded display device DD according to an embodiment, and FIG. 2B is a side view showing the folded display device DD shown in FIG. 2A according to an embodiment.

Referring to FIGS. 2A and 2B, the display device DD may be folded or unfolded without being broken. The folding area FA may be folded about a folding axis FX (refer to FIG. 1) that extends in the second direction DR2, so that the display device DD may be folded to make the areas NFA1 and NFA2 overlap each other. The folding axis FX may be substantially parallel to a short side of the display device DD. The folding axis FX may be substantially parallel to a long side of the display device DD.

When the display device DD is folded, the first non-folding area NFA1 may face the second non-folding areas NFA2, and the second non-folding area NFA2 may overlap a portion of the first non-folding area NFA1. The portion of the first non-folding area NFA1 covered by the second non-folding area NFA2 may be defined as a cover area CA, and the portion of the first non-folding area NFA1 not covered by the second non-folding area NFA2 may be defined as an exposed area EA. The exposed area EA may include a part of the display area through which the image IM is displayed. The display device DD may provide information through the exposed area EA while being in a folded state.

An antenna ATN may be disposed in the exposed area EA of the first non-folding area NFA1. FIG. 2A shows two antennas ATN. The number of the antennas ATN should not be limited to two. The two antennas ATN may be spaced apart from each other in the second direction DR2 and may be disposed at opposite ends of the exposed area EA in the second direction DR2.

The antenna ATN may include an antenna pattern PT (refer to FIG. 11) and a transmission line TL (refer to FIG. 11) for providing signals to the antenna pattern PT. The antenna pattern PT may transmit and/or receive signals. A position of the antenna ATN shown in FIG. 2A may be a position of the antenna pattern PT.

The antenna ATN may be disposed in the exposed area EA of the first non-folding area NFA1. Although the display device DD is folded, the antenna ATN may not be covered by a case or a housing of the display device DD. Accordingly, the antenna ATN may effectively receive and/or transmit signals, e.g., high-frequency signals for 5G mobile communications, without significant loss.

Figure 3A:
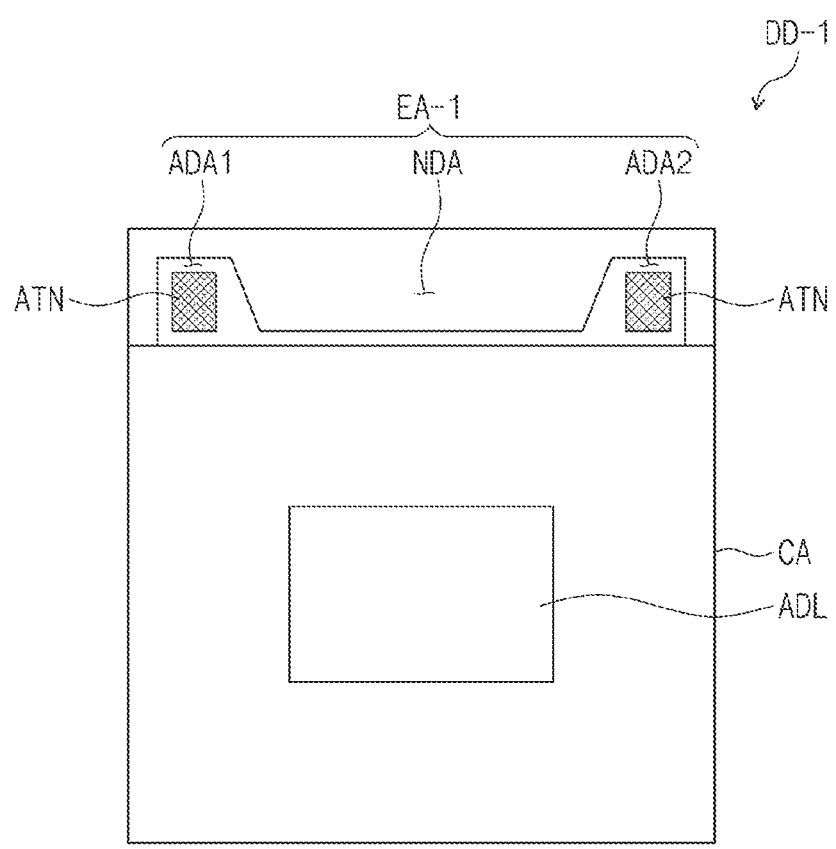
FIG. 3A is a plan view showing a folded display device according to an embodiment.
Figure 3B:
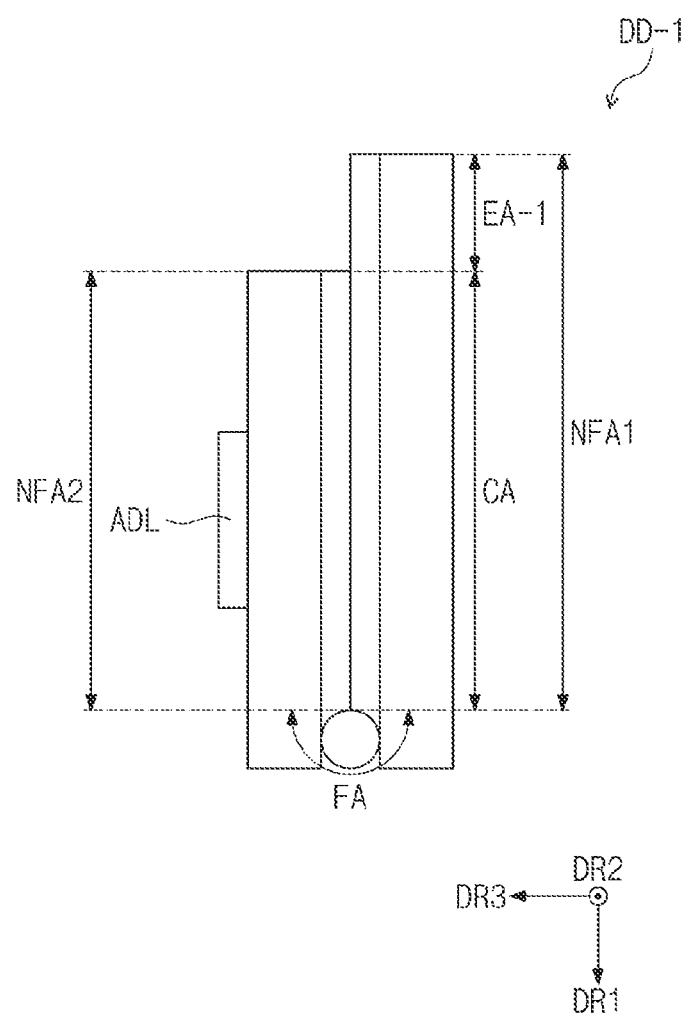
FIG. 3B is a side view showing the folded display device shown in FIG. 3A according to an embodiment.

FIG. 3A is a plan view showing a folded display device DD-1 according to an embodiment. FIG. 3B is a side view showing the folded display device DD-1 shown in FIG. 3A according to an embodiment.

In FIGS. 3A and 3B, different features from those shown in FIGS. 2A and 2B will be mainly described. In FIGS. 3A and 3B, the same reference numerals may denote the same elements in FIGS. 2A and 2B.

Referring to FIGS. 3A and 3B, an exposed area EA-1 of a first non-folding area NFA1 (not covered by a second non-folding area NFA2) may include a non-display area NDA and auxiliary display areas ADA1 and ADA2. The auxiliary display areas ADA1 and ADA2 may include a first auxiliary display area ADA1 and a second auxiliary display area ADA2.

The non-display area NDA may be between the first auxiliary display area ADA1 and the second auxiliary display area ADA2. The first auxiliary display area ADA1, the non-display area NDA, and the second auxiliary display area ADA2 may be sequentially arranged in the second direction DR2. Electronic modules may be disposed in the non-display area NDA.

An antenna ATN may be disposed in the first auxiliary display area ADA1 and/or the second auxiliary display area ADA2. Since the antenna ATN is disposed in the exposed area EA-1, even when the display device DD-1 is in the folded state, the antenna ATN may effectively transmitted and/or received signals. FIG. 3A shows two antennas ATN. The number of the antennas ATN may be greater or less than two. The antenna ATN may be disposed only in the first auxiliary display area ADA1.

The display device DD-1 may further include an auxiliary display layer ADL. The auxiliary display layer ADL may provide an exposed display surface when the display device DD-1 is folded. The auxiliary display layer ADL may overlap the second non-folding area NFA2. An image displaying direction of the second non-folding area NFA2 may be opposite to an image displaying direction of the auxiliary display layer ADL.

When the display device DD-1 is folded, the auxiliary display layer ADL may overlap both the second non-folding area NFA2 and the cover area CA. The display device DD-1 may display an image through the auxiliary display layer ADL. The auxiliary display layer ADL may be operated independently or dependently from the first auxiliary display area ADA1 and the second auxiliary display area ADA2. An additional antenna ATN may be disposed on the auxiliary display layer ADL.

Figure 4:
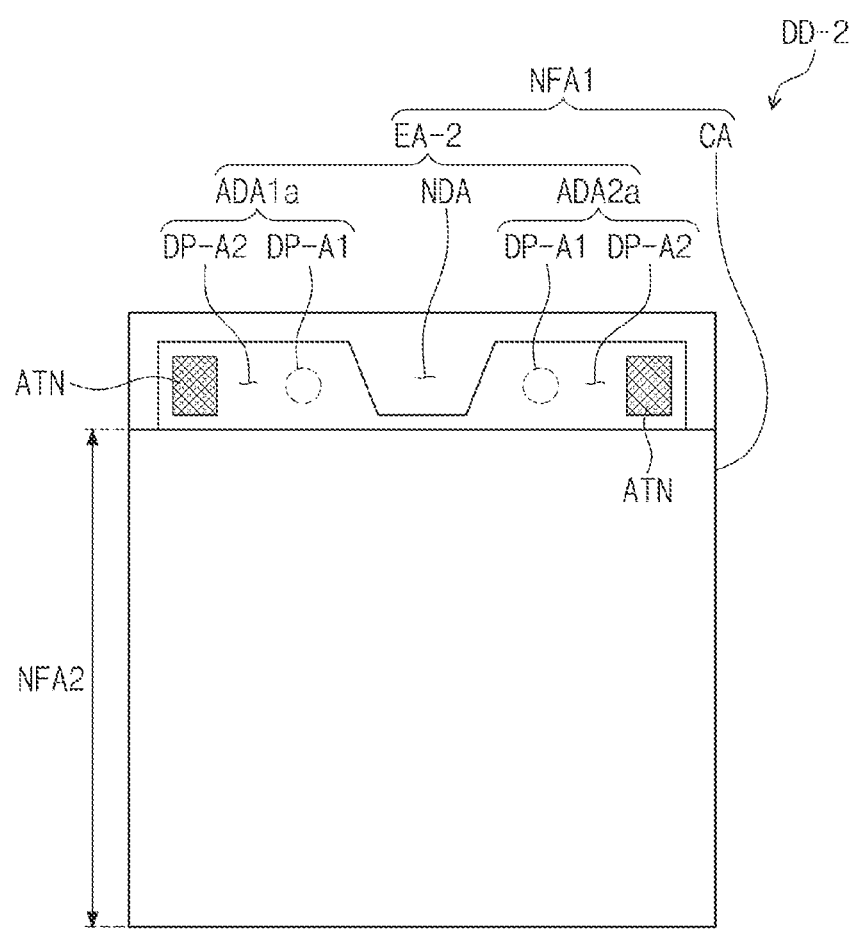
FIG. 4 is a plan view showing a folded display device according to an embodiment.

FIG. 4 is a plan view showing a folded display device DD-2 according to an embodiment.

Referring to FIG. 4, a first non-folding area NFA1 may include an exposed area EA-2. The exposed area EA-2 may not be covered by a second non-folding area NFA2 when the display device DD-2 is folded. The exposed area EA-2 may include a non-display area NDA and auxiliary display areas ADA1$a$ and ADA2$a$. The non-display area NDA may be defined between a first auxiliary display area ADA1$a$ and a second auxiliary display area ADA2$a$. The first auxiliary display area ADA1$a$, the non-display area NDA, and the second auxiliary display area ADA2$a$ may be sequentially arranged in the second direction DR2.

Each of the auxiliary display areas ADA1$a$ and ADA2$a$ may include a first area DP-A1 and a second area DP-A2. The first area DP-A1 may overlap an electronic module. A transmissive area may be provided in the first area DP-A1. An external input, e.g. a light, may be provided to the electronic module through the first area DP-A1, and/or an output from the electronic module may be emitted to the outside through the first area DP-A1. The first area DP-A1 may have one or more shapes, such as a circular shape, a polygonal shape, an oval shape, a figure having at least one curved side, or an irregular shape.

The electronic module may be a camera module, a sensor that measures a distance (such as a proximity sensor), a sensor that recognizes a part of a user's body (e.g., a fingerprint, an iris, or a face), or a small lamp that outputs a light.

The number of the pixels arranged in the first area DP-A1 may be smaller than the number of the pixels arranged in the second area DP-A2 to enable a sufficient size of the transmissive area. In the first area DP-A1, the transmissive area may include no light emitting element 100PE (refer to FIG. 9).

The number of pixels disposed in the first area DP-A1 within a unit area or an area of the same size may be smaller than the number of pixels disposed in the second area DP-A2 within the unit area or the area of the same size. An image display resolution of the first area DP-A1 may be about ½, ⅜, ⅓, ¼, 2/9, ⅛, 1/9, or 1/16 of an image display resolution of the second area DP-A2. For example, the resolution of the second area DP-A2 may be equal to or greater than 400 ppi, and the resolution of the first area DP-A1 may be about 200 ppi or about 100 ppi.

The second area DP-A2 may have a transmittance lower than that of the first area DP-A1. No antenna ATN may be disposed in the first area DP-A1, and an antenna ATN may be disposed in the second area DP-A2.

The structure of the second auxiliary display area ADA2a may be substantially the same as, analogous to, or different from the structure of the first auxiliary display area ADA1a. One of the first auxiliary display area ADA1a and the second auxiliary display area ADA2a may be optional. The display device DD-2 may include only the first auxiliary display area ADA1a or only the second auxiliary display area ADA2a. The second auxiliary display area ADA2a may not include the first area DP-A1.

Figure 5A:
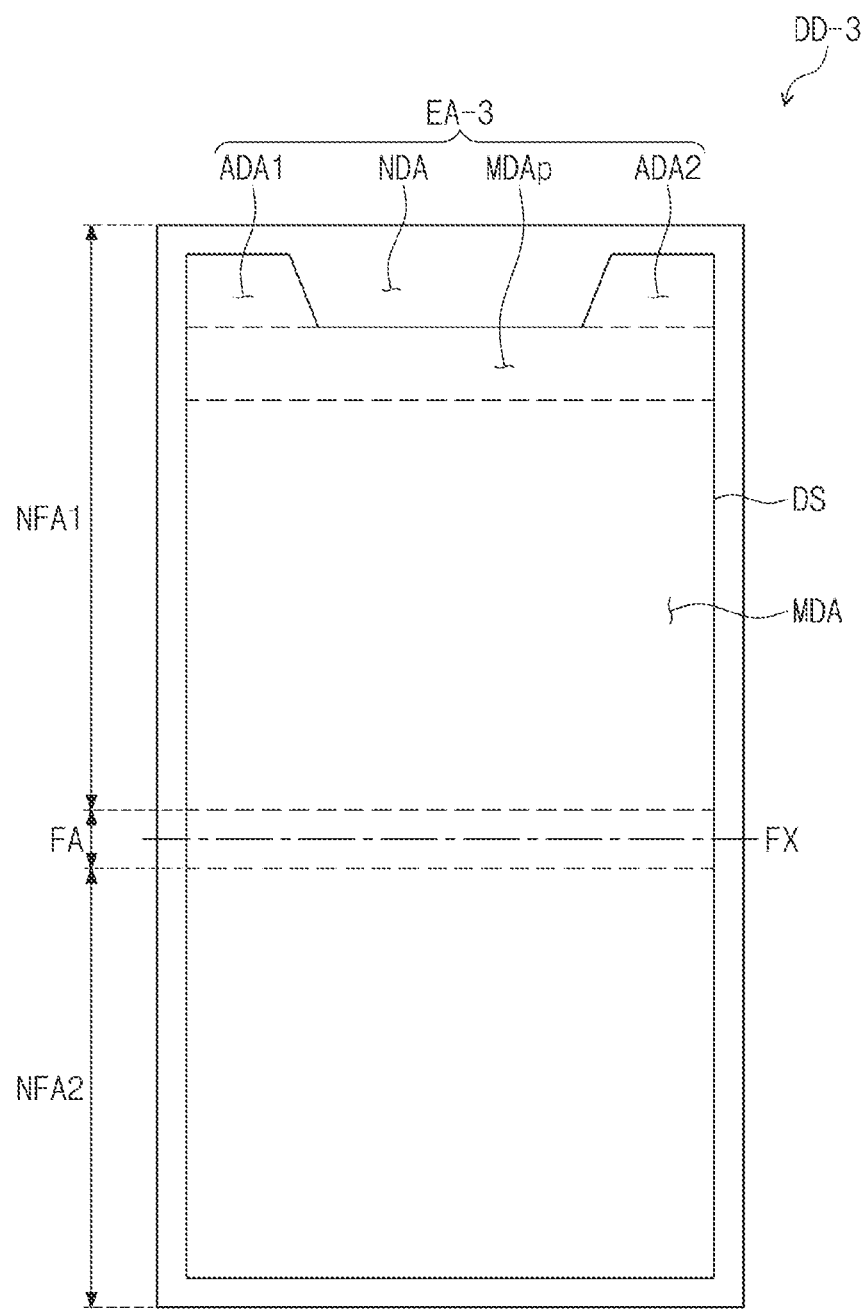
FIG. 5A is a plan view showing a display device according to an embodiment.
Figure 5B:
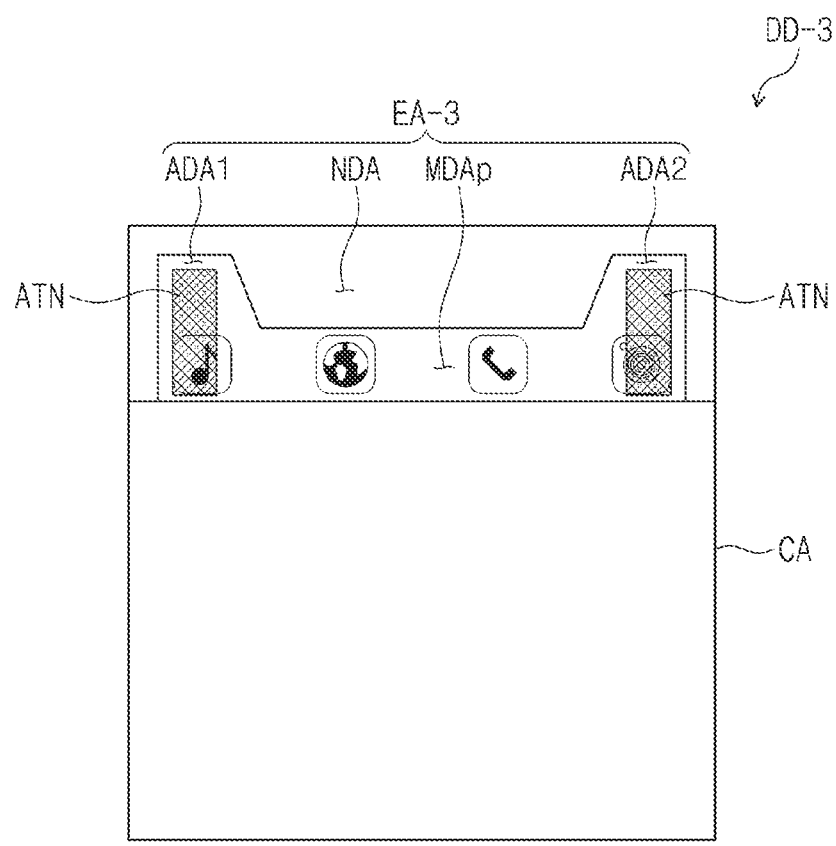
FIG. 5B is a plan view showing a folded state of the display device according to an embodiment.

FIG. 5A is a plan view showing a display device DD-3 according to an embodiment, and FIG. 5B is a plan view showing a folded state of the display device DD-3 shown in FIG. 5A according to an embodiment. In FIGS. 5A and 5B, different features from those shown in FIGS. 2A and 2B will be mainly described. In FIGS. 5A and 5B, the same reference numerals may denote the same elements in FIGS. 2A and 2B.

Referring to FIGS. 5A and 5B, the display device DD-3 may include a display surface DS extending in the first direction DR1 and in the second direction DR2 and may include a non-display area NDA. The display device DD-3 may display image through the display surface DS in response to input signals, and the non-display area NDA may not display images in response to input signals.

The display surface DS may include a main display area MDA, a first auxiliary display area ADA1, and a second auxiliary display area ADA2. Each of the first auxiliary display area ADA1 and the second auxiliary display area ADA2 may extend from the main display area MDA. Each of the first auxiliary display area ADA1 and the second auxiliary display area ADA2 may be protruded convexly from a part/edge MDAp of the main display area MDA. Each of the first auxiliary display area ADA1 and the second auxiliary display area ADA2 may abut the main display area MDA in the first direction DR1. Each of the first auxiliary display area ADA1 and the second auxiliary display area ADA2 may be narrower than the main display area MDA in the second direction DR2.

When a folding area FA is folded about a folding axis FX, a portion of a first non-folding area NFA1 may be covered by a second non-folding area NFA2. When the display device DD-3 is folded, an exposed area EA-3 may not be covered by the second non-folding area NFA2. The exposed area EA-3 may include the first auxiliary display area ADA1, the non-display area NDA, the second auxiliary display area ADA2, and a portion MDAp of the main display area MDA.

When the display device DD-3 is folded, one or more images may be displayed through the first auxiliary display area ADA1, the second auxiliary display area ADA2, and the portion MDAp of the main display area MDA; a row of application icons may be displayed in the portion MDAp of the main display area MDA. Images such as music, internet, phone, and clock icons are shown as an example. Other application icons may be displayed through the portion MDAp of the main display area MDA, or icons may not be displayed.

One or more antennas ATN may overlap the first auxiliary display area ADA1 and the portion MDAp of the main display area MDA and/or may overlap the second auxiliary display area ADA2 and the portion MDAp of the main display area MDA. FIG. 5B shows two antennas ATN. The number of the antennas ATN may be greater or less than two. The antenna ATN may overlap only the first auxiliary display area ADA1 and the portion MDAp of the main display area MDA.

Figure 6:
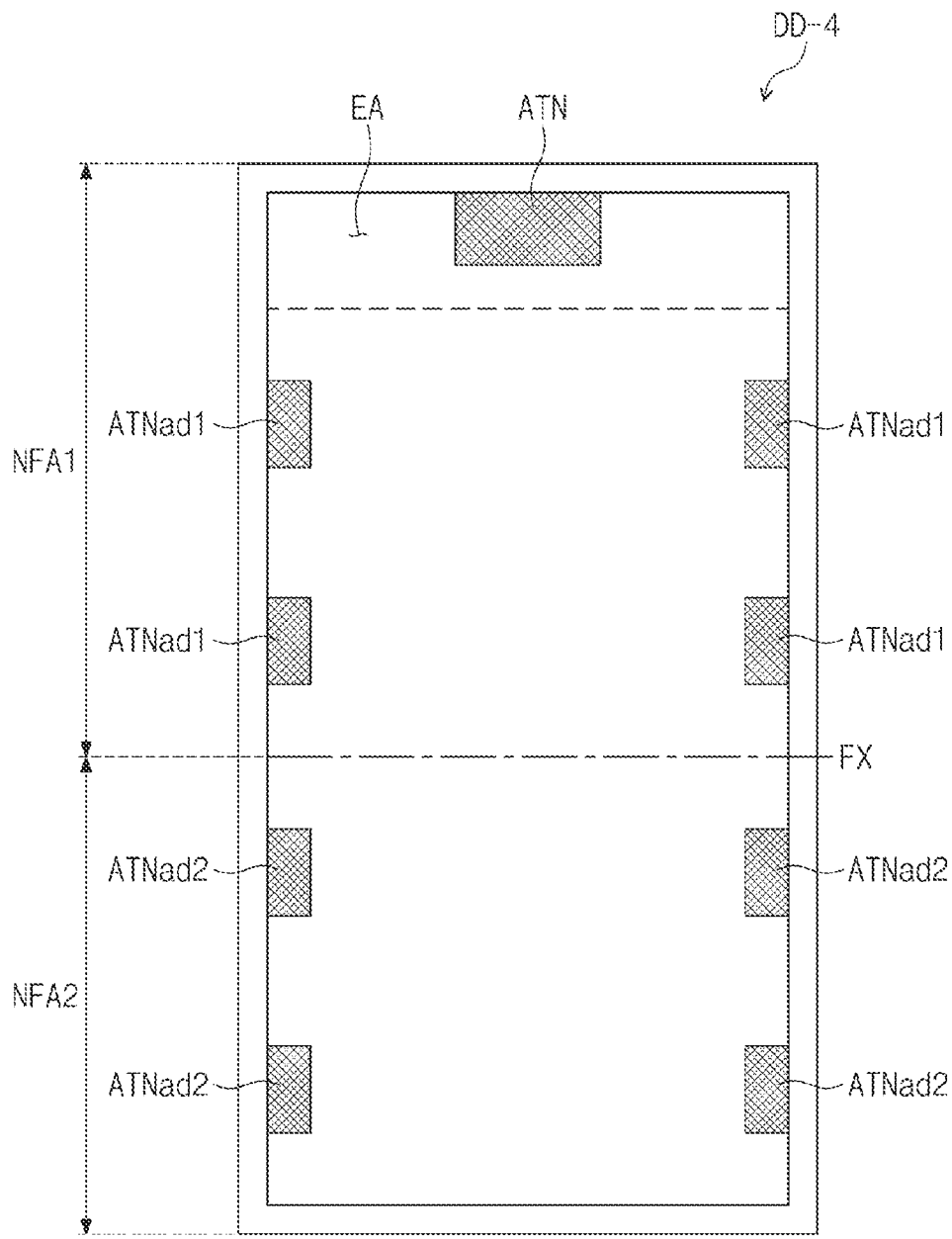
FIG. 6 is a plan view showing a display device according to an embodiment.

FIG. 6 is a plan view showing a display device DD-4 according to an embodiment.

Referring to FIG. 6, the display device DD-4 may be bent/folded about a folding axis FX substantially extending in the second direction DR2.

The display device DD-4 may include an antenna ATN disposed in an exposed area EA, first additional antennas ATNad1 overlapping a first non-folding area NFA1, and second additional antennas ATNad2 overlapping a second non-folding area NFA2. First additional antennas ATNad1 may be disposed at opposite ends/sides of a portion of the first non-folding area NFA1 that is covered by the second non-folding area NFA2 when the display device DD-4 is folded. Second additional antennas ATNad2 may be disposed at opposite ends/sides of the second non-folding area NFA2.

The display device DD-4 may include the antennas ATN, ATNad1, and ATNad2. FIG. 6 shows nine antennas ATN, ATNad1, and ATNad2. The number of the antennas ATN, ATNad1, and ATNad2 may be greater or less than nine. The display device DD-4 may include ten or more antennas ATN, ATNad1, and ATNad2.

Figure 7:
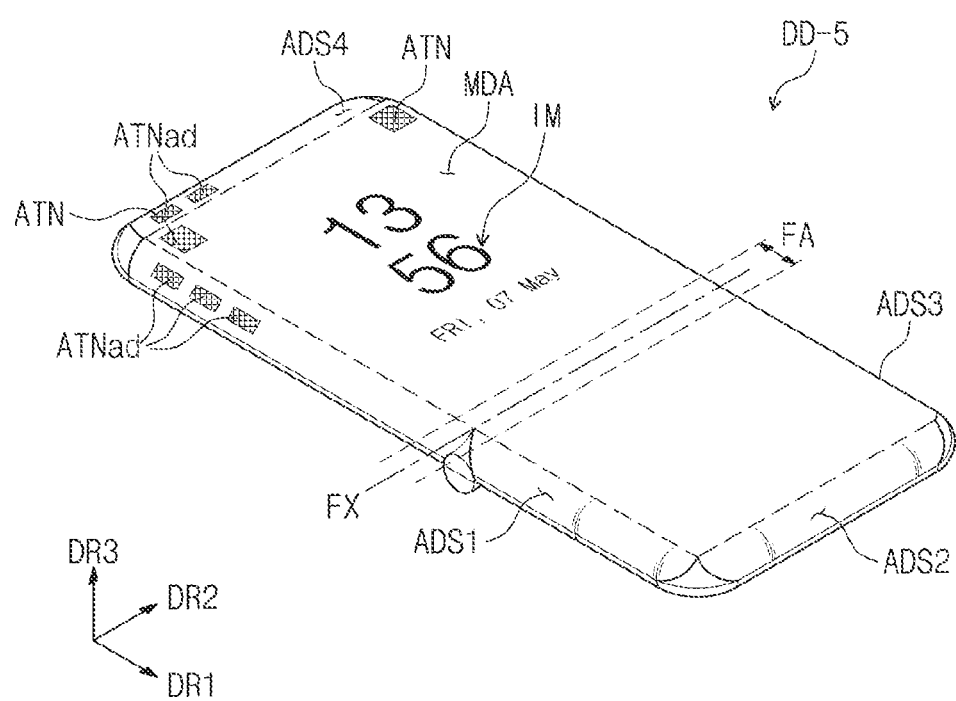
FIG. 7 is a perspective view showing a display device according to an embodiment.

FIG. 7 is a perspective view showing a display device DD-5 according to an embodiment.

Referring to FIG. 7, the display device DD-5 may be bent/folded about a folding axis FX substantially extending in the second direction DR2. The display device DD-5 may include a main display area MDA and auxiliary display surfaces/areas ADS1, ADS2, ADS3, and ADS4 in which one or more images IM may be displayed. FIG. 7 shows a clock widget with date as an example of the image(s) IM.

The auxiliary display surfaces ADS1, ADS2, ADS3, and ADS4 may include a first auxiliary display surface ADS1, a second auxiliary display surface ADS2, a third auxiliary display surface ADS3, and a fourth auxiliary display surface ADS4. The first auxiliary display surface ADS1 may extend from a first side of the main display area MDA. The second auxiliary display surface ADS2 may extend from a second side of the main display area MDA. The third auxiliary display surface ADS3 may extend from a third side of the main display area MDA. The fourth auxiliary display surface ADS4 may extend from a fourth side of the main display area MDA.

Each of the first auxiliary display surface ADS1, the second auxiliary display surface ADS2, the third auxiliary display surface ADS3, and the fourth auxiliary display surface ADS4 may be bent relative to the main display area MDA and may have a predetermined curvature. Each of the first auxiliary display surface ADS1 and the third auxiliary display surface ADS3 may have a cut-away structure in an area overlapping a folding area FA (and/or a hinge). A first image displayed in the main display area MDA and one or more second images displayed in one or more of the auxiliary display surfaces/areas ADS1, ADS2, ADS3, and ADS4 may be related to each other. A picture, a scene from a movie, or UI/UX design may be a combination of the first image and the second image(s).

Due to the bent and/or curved auxiliary display surfaces ADS1, ADS2, ADS3, and ADS4, the display device DD-5 may aesthetically desirable, and a size of anon-display area NDA perceived by the user may be desirably reduced.

The display device DD-5 may include an antenna ATN disposed in an exposed area EA and one or more additional antennas ATNad disposed on one or more of the auxiliary display surfaces ADS1, ADS2, ADS3, and ADS4.

Multiple additional antennas ATNad may be disposed on the first auxiliary display surface ADS land/or the fourth auxiliary display surface ADS4. FIG. 7 shows three additional antennas ATNad disposed on the first auxiliary display surface ADS1 and two additional antennas ATNad disposed on the fourth auxiliary display surface ADS4. The number and positions of the additional antennas ATNad may be configured according to embodiments. The display device DD-5 may include six or more additional antennas ATNad disposed on the second auxiliary display surface ADS2 and/or the third auxiliary display surface ADS3.

Figure 8:
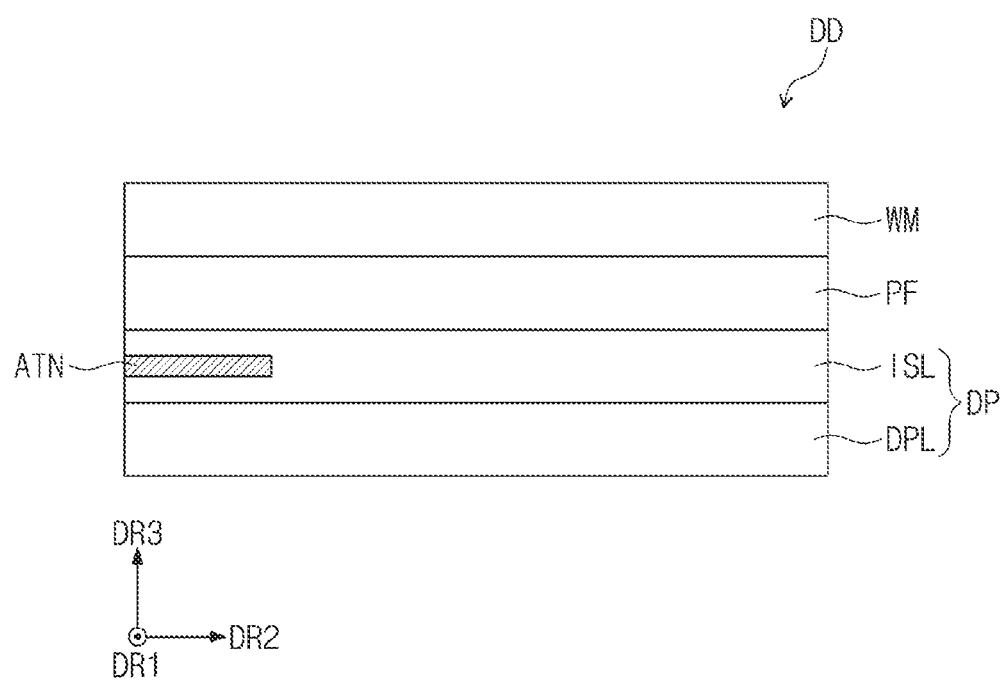
FIG. 8 is a cross-sectional view schematically showing a display device according to an embodiment.

FIG. 8 is a cross-sectional view schematically showing a display device DD according to an embodiment.

Referring to FIG. 8, the display device DD may include a display panel DP, an optical film PF, an antenna ATN, and a window WM. The display panel DP may include a display layer DPL and a sensor layer ISL disposed on the display layer DPL. The antenna ATN may be disposed in the sensor layer ISL.

Some of the above-mentioned components may be optional, and/or other components may be added. One or more adhesive layers may be disposed between some of the components. The adhesive layer(s) may be an optically clear adhesive (OCA) film or a pressure sensitive adhesive (PSA) film.

The display layer DPL may display images according to input signals. The display layer DPL may be a light emitting type display layer. For example, the display layer DPL may be an organic light emitting display layer, an inorganic light emitting display layer, an organic-inorganic light emitting display layer, a quantum dot display layer, a micro-LED display layer, or a nano-LED display layer.

The sensor layer ISL may be disposed on the display layer DPL. The sensor layer ISL may sense an external input. The sensor layer ISL may be manufactured separately from the display layer DPL and attached to the display layer DPL, or the sensor layer ISL may be an integrated type sensor formed through consecutive processes during a manufacturing process of the display layer DPL.

The optical film PF may reduce reflectance of a light incident from the outside. The optical film PF may include a retarder and/or a polarizer. The optical film PF may include at least a polarizing film. The optical film PF may be attached to the display panel DP by an adhesive layer.

The optical film PF may include color filters. The color filters may be arranged in a predetermined arrangement. The arrangement of the color filters may be determined by taking into account colors of lights emitted from pixels included in the display layer DPL. The optical film PF may further include a black matrix adjacent to the color filters. The adhesive layer between the optical film PF and the display panel DP may be optional.

The optical film PF may include a destructive interference structure. For instance, the destructive interference structure may include a first reflective layer and a second reflective layer disposed on a layer different from a layer on which the first reflective layer is disposed. A first reflective light and a second reflective light respectively reflected from the first reflective layer and the second reflective layer may destructively interfere with each other; thus, the reflectance of the external light may be reduced. The adhesive layer between the optical film PF and the display panel DP may be optional.

The antenna ATN may be built/provided in the sensor layer ISL. The antenna ATN may transmit and/or receive wireless communication signals. The antenna ATN may be referred to as a radio frequency device. The antenna ATN may include patch portions (or radiating portions). The patch portions may transmit and/or receive signals of the same frequency band or different frequency bands.

The window WM may be disposed on the optical film PF. The window WM may include an optically transparent insulating material. The window WM may include glass or plastic. The window WM may have a single-layer or multi-layer structure. For example, the window WM may include plastic films attached to each other by one or more adhesives and/or may include a glass substrate and a plastic film attached to the glass substrate by an adhesive.

Figure 9:
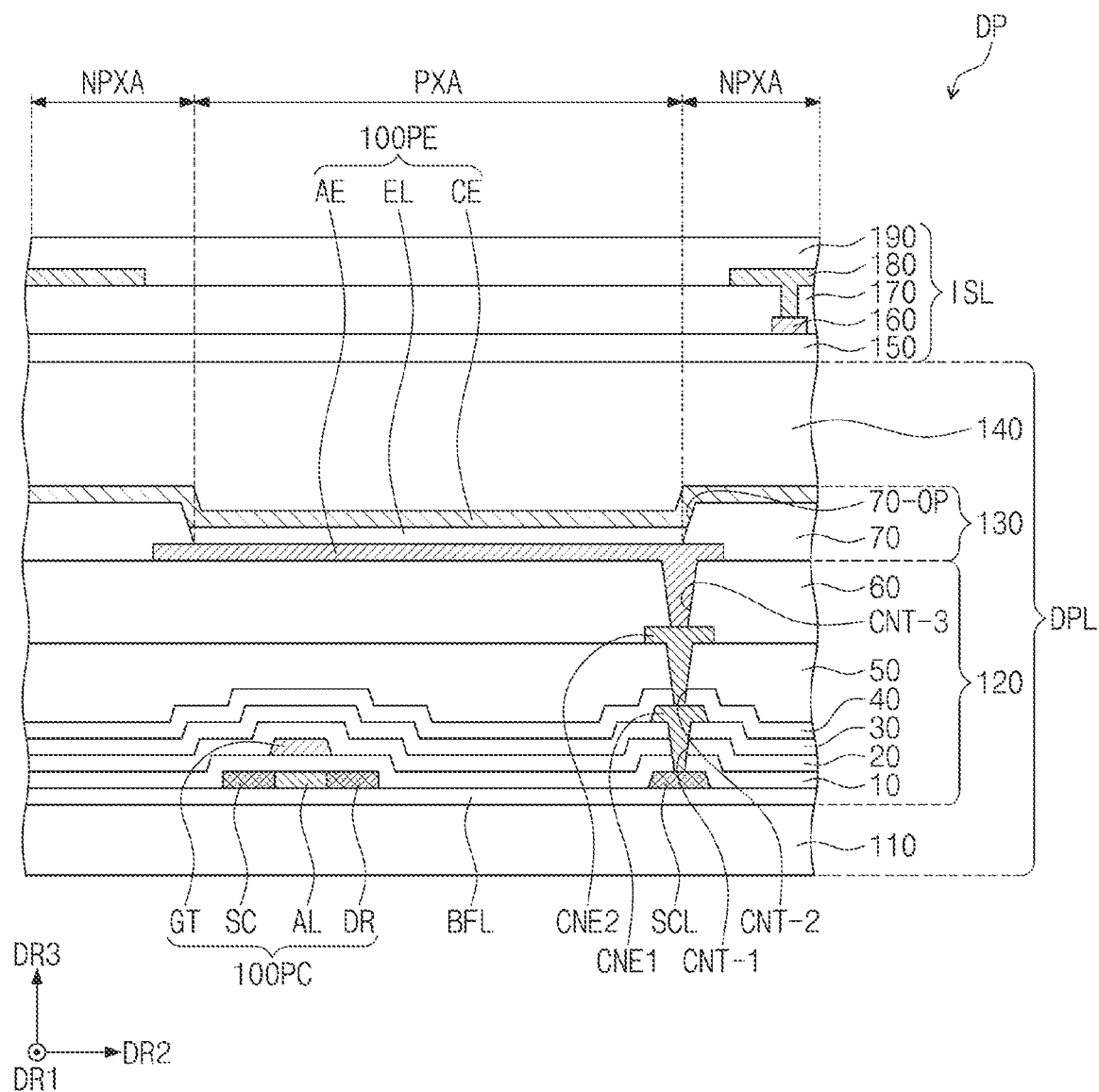
FIG. 9 is a cross-sectional view showing a display panel according to an embodiment.

FIG. 9 is a cross-sectional view showing the display panel DP according to an embodiment.

Referring to FIG. 9, the display layer DPL may include a base layer 110, a circuit layer 120, a light emitting element layer 130, and an encapsulation layer 140.

The base layer 110 may support the circuit layer 120. The base layer 110 may be a glass substrate, a metal substrate, or a polymer substrate. The base layer 110 may be an inorganic layer, an organic layer, or a composite material layer.

The base layer 110 may have a multi-layer structure. For instance, the base layer 110 may include a first synthetic resin layer, a silicon oxide ($SiO_x$) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. Each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. The term "X-based resin" may refer a resin that includes a functional group of X.

At least one inorganic layer may be formed on an upper surface of the base layer 110. The inorganic layer may include at least one of aluminum oxide, titanium oxide, silicon oxide, silicon nitride, silicon oxynitride, zirconium oxide, and hafnium oxide. The inorganic layer may include multiple layers. The inorganic layers may include a barrier layer and/or a buffer layer. The display layer DPL may include a buffer layer BFL.

The buffer layer BFL may increase a coupling force between the base layer 110 and a semiconductor pattern. The buffer layer BFL may include at least one of silicon oxide, silicon nitride, and silicon oxynitride. The buffer layer BFL may include silicon oxide layers and silicon nitride layers alternately stacked with each other.

The semiconductor pattern may be disposed on the buffer layer BFL. The semiconductor pattern may include poly silicon. The semiconductor pattern may include amorphous silicon, low-temperature polycrystalline silicon, or oxide semiconductor.

FIG. 9 shows only a portion of the semiconductor pattern, and the semiconductor pattern may be further disposed in other areas. The semiconductor pattern may be arranged with a specific rule over the pixels. Regions of the semiconductor pattern may have different electrical properties depending on whether the regions are doped or not and/or whether the regions are doped with an N-type dopant or a P-type dopant. The semiconductor pattern may include a first region with high conductivity and a second region with low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or may be doped at a concentration lower than that of the high conductivity region.

The first region may have a conductivity greater than that of the second region and may substantially serve as an electrode or signal line. The second region may substantially correspond to an active area (or a channel) of a transistor. A first portion of the semiconductor pattern may be the active area of the transistor, a second portion of the semiconductor pattern may be a source or a drain of the transistor, and a third portion of the semiconductor pattern may be a connection electrode or a connection signal line.

Each of the pixels may include seven transistors, one capacitor, and the light emitting element. The pixels may be configured in various ways. FIG. 9 shows one transistor 100PC and the light emitting element 100PE included in the pixel.

The source SC, the active area AL (or an active), and the drain DR of the transistor 100PC may be portions of the semiconductor pattern. The source SC and the drain DR may be positioned at opposite ends of the active area AL. FIG. 9 shows a portion of a connection signal line SCL formed from the semiconductor pattern. Although not shown in figures, the connection signal line SCL may be electrically connected to the drain DR of the transistor 100PC in a plan view of the display panel DP.

A first insulating layer 10 may be disposed on the buffer layer BFL. The first insulating layer 10 may commonly overlap the pixels and may cover the semiconductor pattern. The first insulating layer 10 may include/be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. The first insulating layer 10 may have a single-layer structure of a silicon oxide layer. Not only the first insulating layer 10, but also an insulating layer of the circuit layer 120 may include/be an inorganic layer and/or an organic layer and may have a single-layer or multi-layer structure. The inorganic layer may include at least one of the above-mentioned materials.

A gate GT of the transistor 100PC may be disposed on the first insulating layer 10. The gate GT may be a portion of a metal pattern. The gate GT may overlap the active area AL. The gate GT may be used as a mask in a process of doping the semiconductor pattern.

A second insulating layer 20 may be disposed on the first insulating layer 10 and may cover the gate GT. The second insulating layer 20 may commonly overlap the pixels. The second insulating layer 20 may be an inorganic layer and/or an organic layer and may have a single-layer or multi-layer structure. The second insulating layer 20 may include at least one of silicon oxide, silicon nitride, and silicon oxynitride. The second insulating layer 20 may have a multi-layer structure of a silicon oxide layer and a silicon nitride layer.

A third insulating layer 30 may be disposed on the second insulating layer 20. The third insulating layer 30 may have a single-layer structure or a multi-layer structure. The third insulating layer 30 may have the multi-layer structure of a silicon oxide layer and a silicon nitride layer.

A first connection electrode CNE1 may be disposed on the third insulating layer 30. The first connection electrode CNE1 may be connected to the connection signal line SCL via a contact hole CNT-1 defined through the first, second, and third insulating layers 10, 20, and 30.

A fourth insulating layer 40 may be disposed on the third insulating layer 30 and may cover the first connection electrode CNE1. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 via a contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element 100PE. For example, the light emitting element layer 130 may include an organic light emitting material, a quantum dot, a quantum rod, a micro-LED, or a nano-LED. An organic light emitting element is described as an example of the light emitting element 100PE.

The light emitting element 100PE may include a first electrode AE, a light emitting layer EL, and a second electrode CE.

The first electrode AE may be disposed on the sixth insulating layer 60. The first electrode AE may be connected to the second connection electrode CNE2 via a contact hole CNT-3 defined through the sixth insulating layer 60.

A pixel definition layer 70 may be disposed on the sixth insulating layer 60 and may cover a portion of the first electrode AE. An opening 70-OP may be defined through the pixel definition layer 70. At least a portion of the first electrode AE may be exposed through the opening 70-OP of the pixel definition layer 70.

The display surface DS (refer to FIG. 1) and the auxiliary display layer ADL (refer to FIG. 3A) may include a light emitting area PXA and a non-light-emitting area NPXA adjacent to the light emitting area PXA. The non-light-emitting area NPXA may surround the light emitting area PXA. The light emitting area PXA may correspond to the portion of the first electrode AE exposed through the opening 70-OP.

The light emitting layer EL may be disposed on the first electrode AE. The light emitting layer EL may be disposed in the opening 70-OP. A light emitting layer EL may be formed in each of the pixels. Each of the light emitting layers EL may emit light having at least one of blue, red, and green colors. A light emitting layer EL may be commonly provided over the pixels and may emit a blue light or a white light.

The second electrode CE may be disposed on the light emitting layer EL. The second electrode CE may overlap the first electrodes AE of many/all of the pixels.

Although not shown in the figures, a hole control layer may be disposed between the first electrode AE and the light emitting layer EL. The hole control layer may be disposed in the light emitting area PXA and the non-light-emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be commonly formed in the pixels using an open mask.

The encapsulation layer 140 may be disposed on the light emitting element layer 130. The encapsulation layer 140 may include a first inorganic layer, an organic layer, and a second inorganic layer, which are sequentially stacked.

The inorganic layers may protect the light emitting element layer 130 from moisture and oxygen, and the organic layer may protect the light emitting element layer 130 from a foreign substance such as dust particles. The inorganic layers may include a silicon nitride layer, a silicon oxynitride layer, a silicon oxide layer, a titanium oxide layer, or an aluminum oxide layer. The organic layer may include an acrylic-based organic layer.

The sensor layer ISL may include a base layer 150, a first conductive layer 160, a sensing insulating layer 170, a second conductive layer 180, and a cover insulating layer 190.

The base layer 150 may be an inorganic layer that includes at least one of silicon nitride, silicon oxynitride, and silicon oxide. The base layer 150 may be an organic layer that includes an epoxy resin, an acrylic resin, or an imide-based resin. The base layer 150 may have a single-layer structure or a multi-layer structure of layers stacked in the third direction DR3.

Each of the first and second conductive layers 160 and 180 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or an alloy of some of the above metals. The transparent conductive layer may include a transparent conductive oxide, such as indium tin oxide (ITO), indium zinc oxide (IZO), zinc oxide (ZnO), or indium zinc tin oxide (ITZO). The transparent conductive layer may include conductive polymer such as PEDOT, metal nanowire, or graphene.

The conductive layer having the multi-layer structure may include metal layers. The metal layers may have a three-layer structure of titanium-aluminum-titanium. The conductive layer having the multi-layer structure may include at least one metal layer and at least one transparent conductive layer.

At least one of the sensing insulating layer 170 and the cover insulating layer 190 may include an inorganic layer. The inorganic layer may include at least one of aluminum oxide, titanium oxide, silicon oxide, silicon nitride, silicon oxynitride, zirconium oxide, and hafnium oxide.

At least one of the sensing insulating layer 170 and the cover insulating layer 190 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Figure 10:
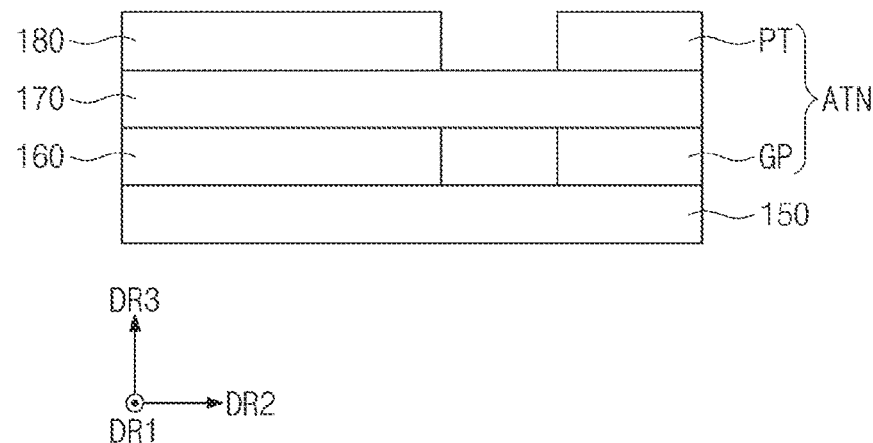
FIG. 10 is a cross-sectional view showing a portion of a display panel according to an embodiment.

FIG. 10 is a cross-sectional view showing a portion of the display panel according to an embodiment.

Referring to FIGS. 9 and 10, the antenna ATN may include the antenna pattern PT (or antenna member PT) and a ground pattern GP (or ground member GP) disposed under the antenna pattern PT. The antenna pattern PT and the ground pattern GP may have a mesh structure.

The antenna pattern PT may be disposed directly on the same layer 170 as the second conductive layer 180 of the sensor layer ISL (refer to FIG. 9). The antenna pattern PT may be substantially simultaneously formed with the second conductive layer 180 using the same material as the second conductive layer 180. The antenna pattern PT may be referred to as the radiation portion or the radiation pattern.

The ground pattern GP may be disposed under the antenna pattern PT. The ground pattern GP may be disposed directly on the same layer 150 as the first conductive layer 160. The ground pattern GP may be substantially simultaneously formed with the first conductive layer 160 using the same material as the first conductive layer 160. The ground pattern GP may be optional.

Figure 11:
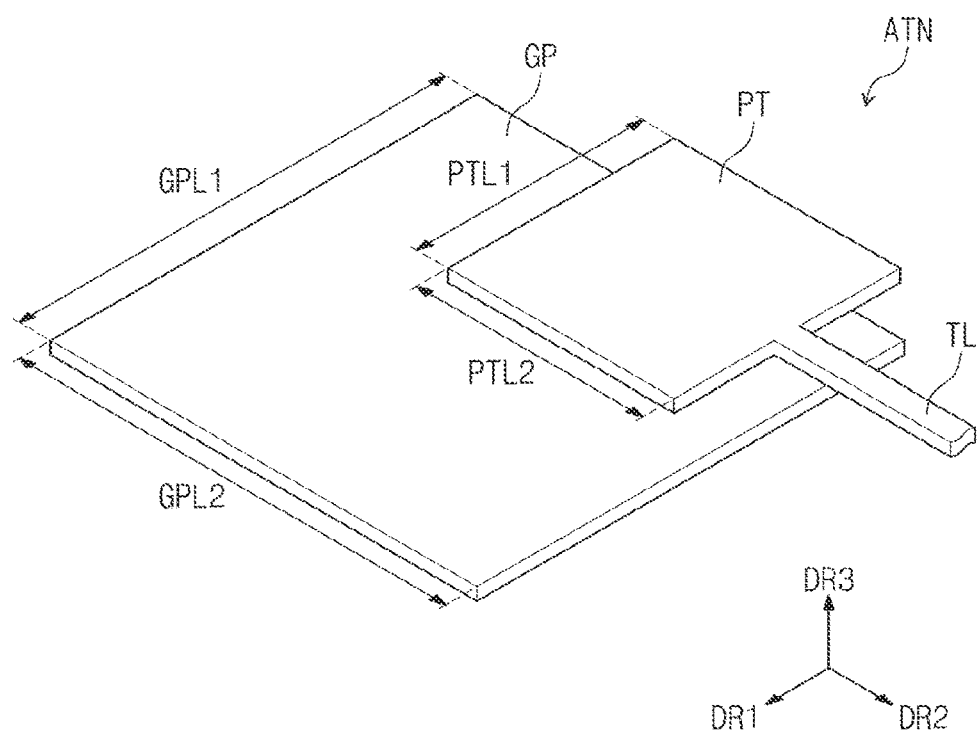
FIG. 11 is a perspective view showing an antenna according to an embodiment.

FIG. 11 is a perspective view showing the antenna ATN according to an embodiment.

Referring to FIGS. 10 and 11, the antenna ATN may include the antenna pattern PT, the transmission line TL connected to the antenna pattern PT, and the ground pattern GP.

The ground pattern GP may have a size greater than a size of the antenna pattern PT. A first side GPL1 of the ground pattern GP and a first side PTL1 of the antenna pattern PT may be substantially parallel to each other and may extend in the first direction DR1. A second side GPL2 of the ground pattern GP and a second side PTL2 of the antenna pattern PT may be substantially parallel to each other and may extend in the second direction DR2. The first side GPL1 and the second side GPL2 of the ground pattern GP may be substantially perpendicular to each other, and the first side PTL1 and the second side PTL2 of the antenna pattern PT may be substantially perpendicular to each other.

The first side GPL1 of the ground pattern GP may be longer than the first side PTL1 of the antenna pattern PT, and the second side GPL2 of the ground pattern GP may be longer than the second side PTL2 of the antenna pattern PT. The length of the first side GPL1 of the ground pattern GP may be two times the length of the first side PTL1 of the antenna pattern PT, and the length of the second side GPL2 of the ground pattern GP may be two times the length of the second side PTL2 of the antenna pattern PT.

Figure 12:
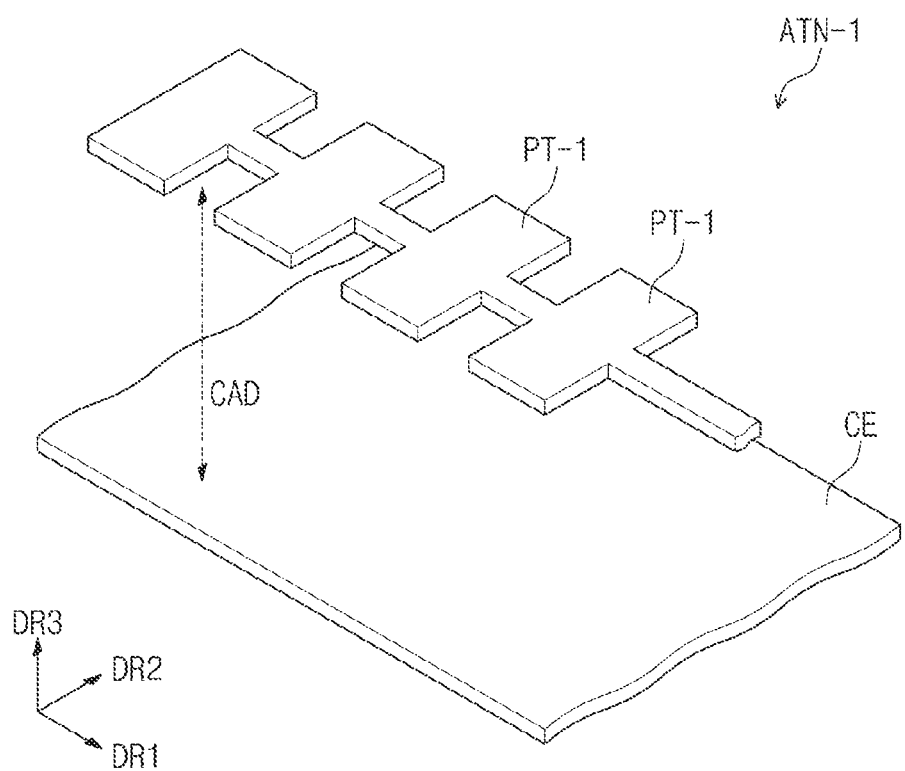
FIG. 12 is a perspective view showing an antenna and a second electrode according to an embodiment.

FIG. 12 is a perspective view showing an antenna ATN-1 and a second electrode CE according to an embodiment.

Referring to FIGS. 9 and 12, the antenna ATN-1 may include antenna patterns PT-1 connected to each other in series. FIG. 12 shows the antenna ATN-1 including four antenna patterns PT-1. The number of the antenna patterns PT-1 of the antenna ATN-1 may be greater or less than four. The antenna ATN-1 may include only one antenna pattern or two or more antenna patterns PT-1.

The antenna ATN described with reference to one or more of FIGS. 1 to 11 may include antenna patterns PT-1 connected to each other in series as the antenna ATN-1 shown in FIG. 12. Some of the antennas ATN included in the display device DD may include one antenna pattern PT, and the other of the antennas ATN included in the display device DD may include plural antenna patterns PT-1 connected to each other in series.

The antenna patterns PT-1 may be spaced apart from the second electrode CE of the display panel DP by a predetermined distance CAD. The distance CAD may be measured in the third direction DR3.

Figure 13:
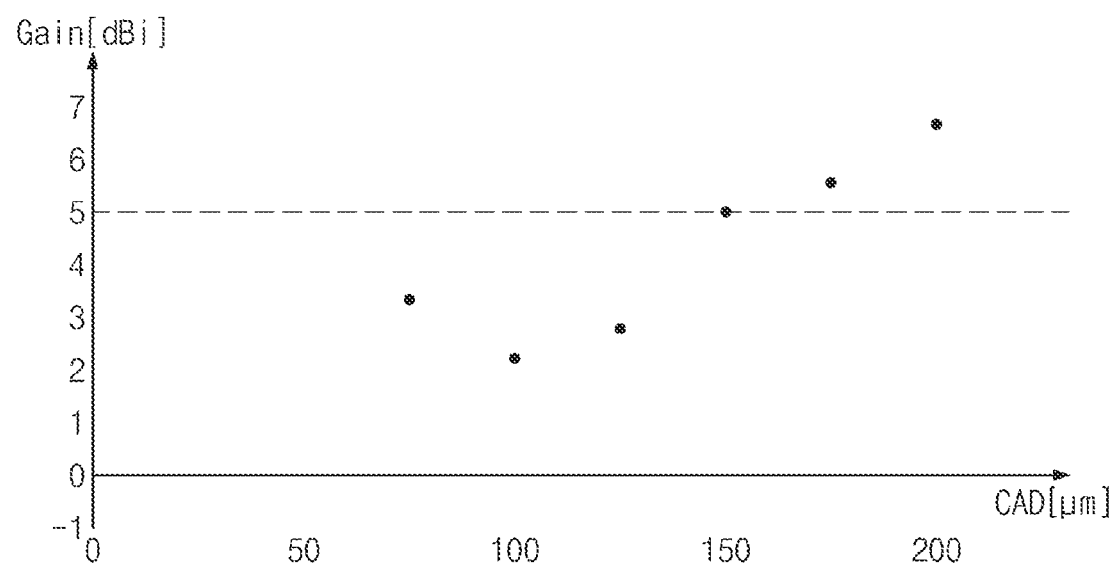
FIG. 13 is a graph showing an antenna gain value according to a distance between a second electrode and an antenna according to one or more embodiments.

FIG. 13 is a graph showing a gain value of an antenna ATN-1 according to a distance CAD between the second electrode CE and the antenna ATN-1 (e.g., the antenna pattern PT-1 of the antenna ATN-1) according to one or more embodiments.

FIG. 13 shows the gain value of the antenna ATN-1 according to the distance CAD between the second electrode CE and the antenna pattern PT-1 of the antenna ANT-1. In FIG. 13, a horizontal axis indicates the distance CAD between the second electrode CE and the antenna pattern PT-1, and a vertical axis indicates the gain value of the antenna ATN-1.

The distance CAD between the antenna ATN-1 and the second electrode CE may be adjusted by taking into account the gain of the antenna ATN-1. As an example, when a minimum gain requirement for the antenna ATN-1 is about 5 dBi, the distance CAD between the second electrode CE and the antenna ATN-1 may be adjusted to be equal to or greater than about 150 micrometers.

Figure 14:
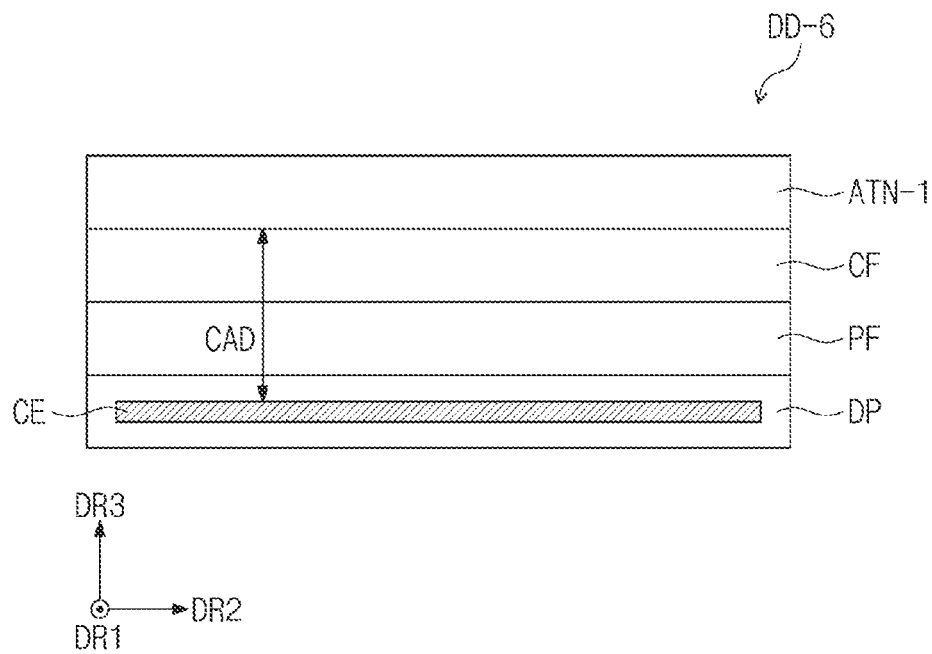
FIG. 14 is a cross-sectional view schematically showing a display device according to an embodiment.

FIG. 14 is a cross-sectional view schematically showing a display device DD-6 according to an embodiment.

Referring to FIG. 14, the display device DD-6 may include a display panel DP, an optical film PF, a compensation film CF (or distance adjustment/setting film CF), and an antenna ATN-1. The optical film PF may be disposed on the display panel DP, and the compensation film CF may be disposed on the optical film PF. The antenna ATN-1 may be disposed on the compensation film CF.

The compensation film CF may be disposed between the display panel DP and the antenna ATN-1 to increase a distance CAD between a second electrode CE and the antenna ATN-1. The compensation film CF may be a transparent film. The position of the compensation film CF may be configured according embodiments. The display panel DP, the optical film PF, compensation film CF, and the antenna ATN-1 may be sequentially stacked in the third direction DR3.

Figure 15:
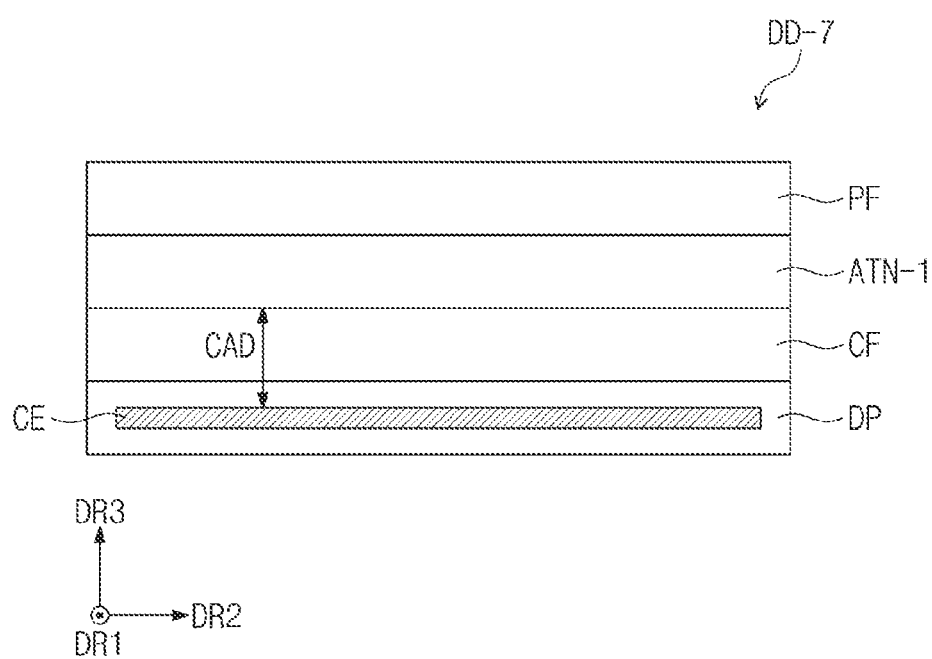
FIG. 15 is a cross-sectional view schematically showing a display device according to an embodiment.

FIG. 15 is a cross-sectional view schematically showing a display device DD-7 according to an embodiment.

Referring to FIG. 15, the display device DD-7 may include a display panel DP, a compensation film CF, an antenna ATN-1, and an optical film PF. The antenna ATN-1 may be disposed between the optical film PF and the display panel DP. The compensation film CF may be disposed between the display panel DP and the antenna ATN-1 to increase a distance CAD between the second electrode CE and the antenna ATN-1. The compensation film CF may be disposed on the display panel DP. The antenna ATN-1 may be disposed on the compensation film CF. The optical film PF may be disposed on the antenna ATN-1.

Figure 16:
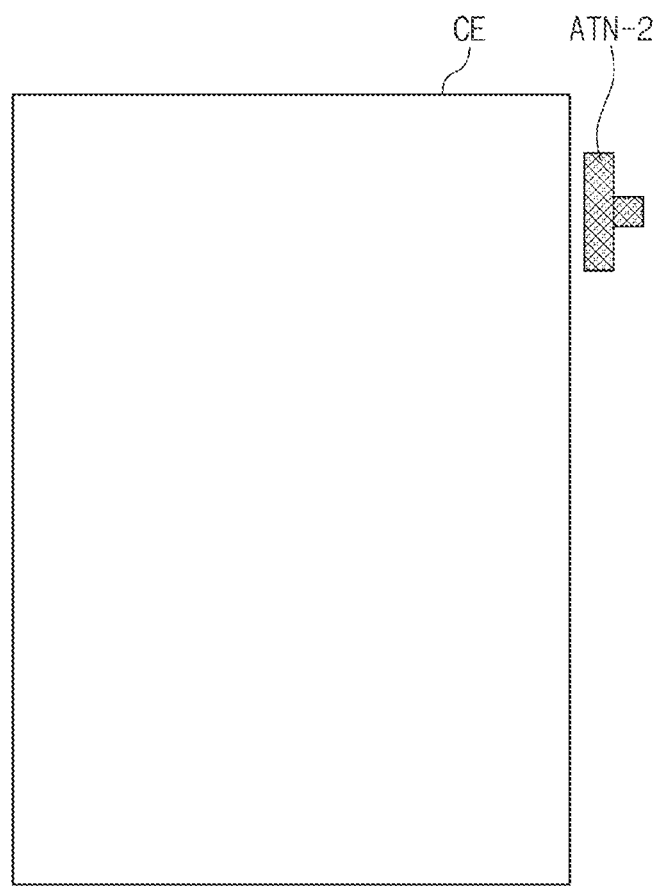
FIG. 16 is a plan view showing some components of a display device according to an embodiment.

FIG. 16 is a plan view showing some components of a display device DD according to an embodiment.

Referring to FIG. 16, a second electrode CE and an antenna ATN-2 are shown. The antenna ATN-2 may be spaced from the second electrode CE in a plan view of the display device DD. A shape and/or a position of the antenna ATN-2 may be changed such that the antenna ATN-2 does not overlap the second electrode CE in the third direction DR3.

As the antenna ATN-2 does not overlap the second electrode CE in the third direction DR3, a noise caused by the second electrode CE and applied to the antenna ATN-2 may be minimized. Advantageously, the reception sensitivity of the antenna ATN-2 may be satisfactory.

Figure 17:
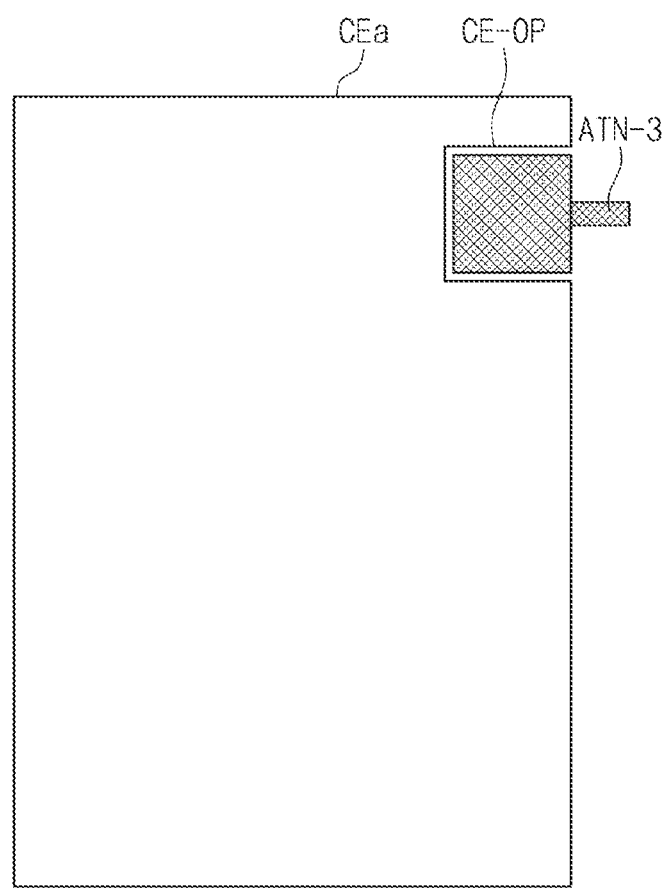
FIG. 17 is a plan view showing some components of a display device according to an embodiment.

FIG. 17 is a plan view showing some components of a display device according to an embodiment.

Referring to FIG. 17, a structure of a second electrode CEa may be configured to accommodate an antenna ATN-3. The second electrode CEa may include an opening CE-OP to accommodate the antenna ATN-3. The antenna ATN-3 may be spaced from the second electrode CEa in a plan view of the display device DD. As the antenna ATN-3 does not overlap the second electrode CEa in the third direction DR3, a noise caused by the second electrode CEa and applied to the antenna ATN-3 may be minimized. Advantageously, the reception sensitivity of the antenna ATN-3 may be improved.

Figure 18:
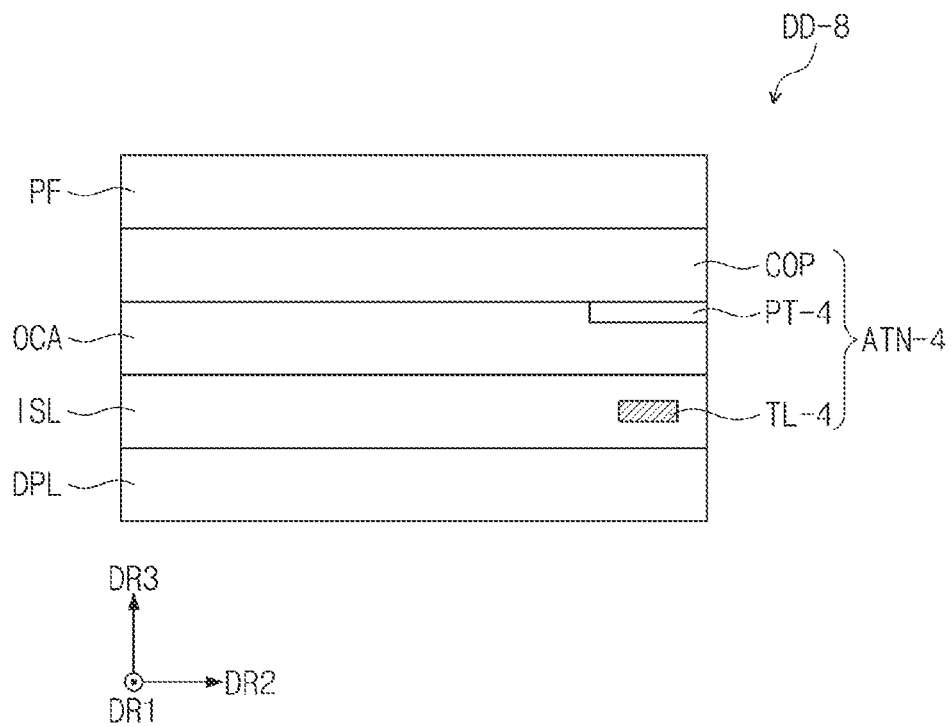
FIG. 18 is a cross-sectional view schematically showing a display device according to an embodiment.

FIG. 18 is a cross-sectional view schematically showing a display device DD-8 according to an embodiment.

Referring to FIG. 18, the display device DD-8 may include a display layer DPL, a sensor layer ISL, an antenna ATN-4, an optical transparent adhesive member OCA, and an optical film PF.

The antenna ATN-4 may include a base film COP, an antenna pattern PT-4 disposed on one surface of the base film COP, and a transmission line TL-4. The transmission line TL-4 may be disposed in the sensor layer ISL. The transmission line TL-4 may be disposed directly on the same insulating layer as the first conductive layer 160 (refer to FIG. 9) or the second conductive layer 180 (refer to FIG. 9). The base film COP (on which the antenna pattern PT-4 is disposed) may be attached to the sensor layer ISL by an optical transparent adhesive member OCA.

The antenna pattern PT-4 and the transmission line TL-4 may not be directly connected to each other. The antenna pattern PT-4 may be indirectly fed or coupled fed (with signals) via the transmission line TL-4.

Figure 19:
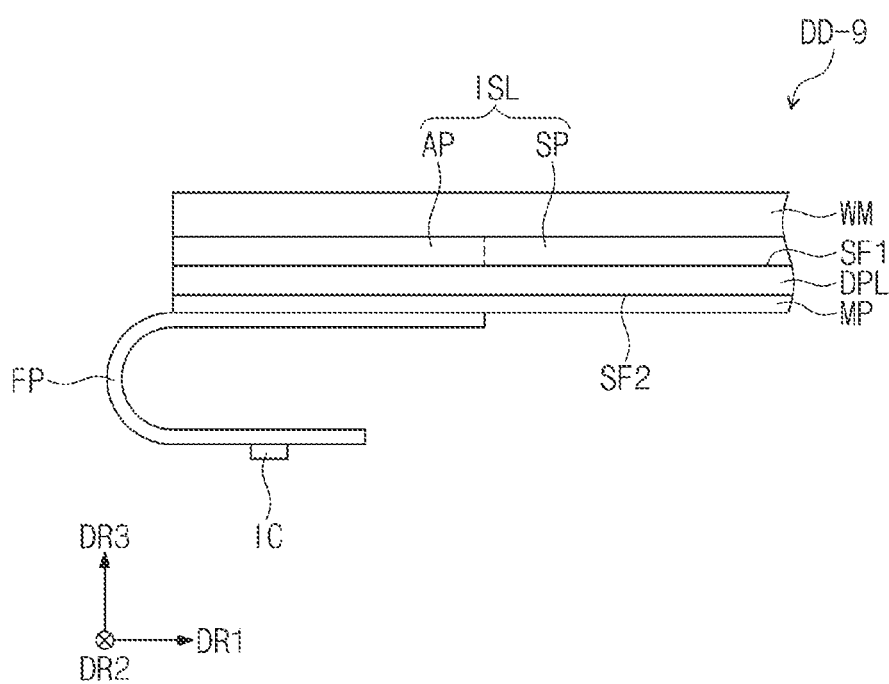
FIG. 19 is a cross-sectional view showing a display device according to an embodiment.
Figure 20:
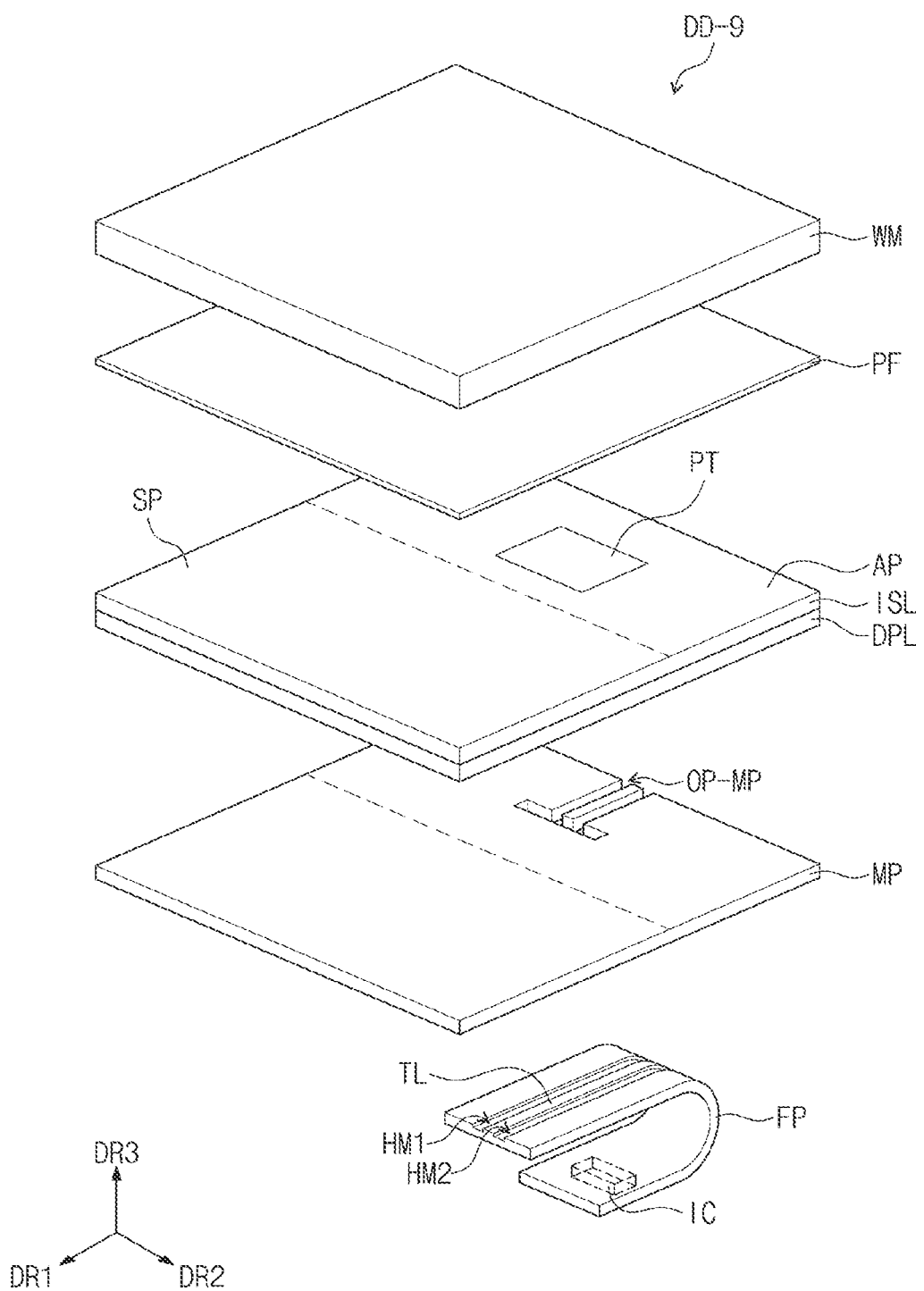
FIG. 20 is an exploded perspective view showing a display device according to an embodiment.

FIG. 19 is a cross-sectional view showing a display device DD-9 according to an embodiment. FIG. 20 is an exploded perspective view showing the display device DD-9 according to an embodiment.

Referring to FIGS. 19 and 20, a display layer DPL may include a first surface SF1 and a second surface SF2. The first surface SF1 and the second surface SF2 may be opposite each other. The first surface SF1 may be referred to as an upper surface of the display layer DPL, and the second surface SF2 may be referred to as a lower surface of the display layer DPL.

A sensor layer ISL may include a sensing area SP and an antenna area AP. The sensor layer ISL may be disposed on the first surface SF1.

A lower layer MP (or intervening layer MP) may be disposed on the second surface SF2. The lower layer MP may be spaced from the sensor layer ISL by the display layer DPL in the third direction DR3. The lower layer MP may include a through opening OP-MP. The opening OP-MP may overlap with and expose an antenna pattern PT.

A driving chip IC may be disposed under the lower layer MP. The driving chip IC may apply a signal to the antenna pattern PT. The driving chip IC may control an operation of the antenna pattern PT. The driving chip IC may adjust a power that is fed to each of a plurality of antenna patterns PT disposed in the antenna area AP to control a beam steering of the antenna patterns PT and may enhance energy utilization by focusing a frequency signal in a specific direction. Therefore, it is able to form a desired radiation pattern, such that the radiation efficiency may be improved. The driving chip IC may be referred to as a beam forming chip IC.

A transmission unit FP may be coupled with a lower surface of the lower layer MP. The transmission unit FP may overlap the opening OP-MP. The transmission unit FP may include a first surface and a second surface opposite the first surface. The driving chip IC may be disposed on the first surface of the transmission unit FP. The transmission unit FP may be bent, and a portion of the second surface of the transmission unit FP may face another portion of the second surface of the transmission unit FP.

The transmission unit FP may have a ground coplanar waveguide (GCPW) structure. A first groove HM1 and a second groove HM2 spaced apart from the first groove HM1 in the second direction DR2 may be defined in the first surface of the transmission unit FP. The first groove HM1 and the second groove HM2 may overlap the opening OP-MP.

The transmission unit FP and the lower layer MP may be coupled with each other by an adhesive member. The adhesive member may be disposed between the transmission unit FP and the lower layer MP. The adhesive member may include an anisotropic conductive film (ACF). The adhesive member may include a pressure sensitive adhesive (PSA) film, an optically clear adhesive (OCA) film, or an optically clear resin (OCR). The adhesive member may not cover the opening OP-MP.

The driving chip IC may transmit a signal via the transmission line TL disposed between the first groove HM1 and the second groove HM2. The transmission line TL may not overlap/cover the opening OP-MP. The signal may be applied to the antenna pattern PT via the opening OP-MP of the lower layer MP. The signals may be emitted to the antenna pattern PT via the opening OP-MP. The signals may be indirectly fed to the antenna pattern PT via the opening OP-MP. The expression "indirectly fed" means that the signals are transmitted without employing components directly connected to the antenna pattern PT.

The display device DD-9 may feed the antenna pattern PT using the opening OP-MP formed through the lower layer MP, wherein the lower layer MP itself is also used to block electromagnetic waves. The display device DD-9 may not include a separate component to feed the antenna pattern PT. A thickness of the display device DD-9 may be minimized.

The transmission unit FP may be coupled with the lower surface of the lower layer MP disposed under the display layer DPL. No component connected to the driving chip IC to feed the antenna pattern PT may be disposed between the display layer DPL and the optical film PF. Advantageously, the image display performance of the display device DD-9 may be satisfactory. No component connected to the driving chip IC to feed the antenna pattern PT may be disposed between the sensor layer ISL and the optical film PF. Advantageously, the external input sensing performance of the display device DD-9 may be satisfactory.

Figure 21:
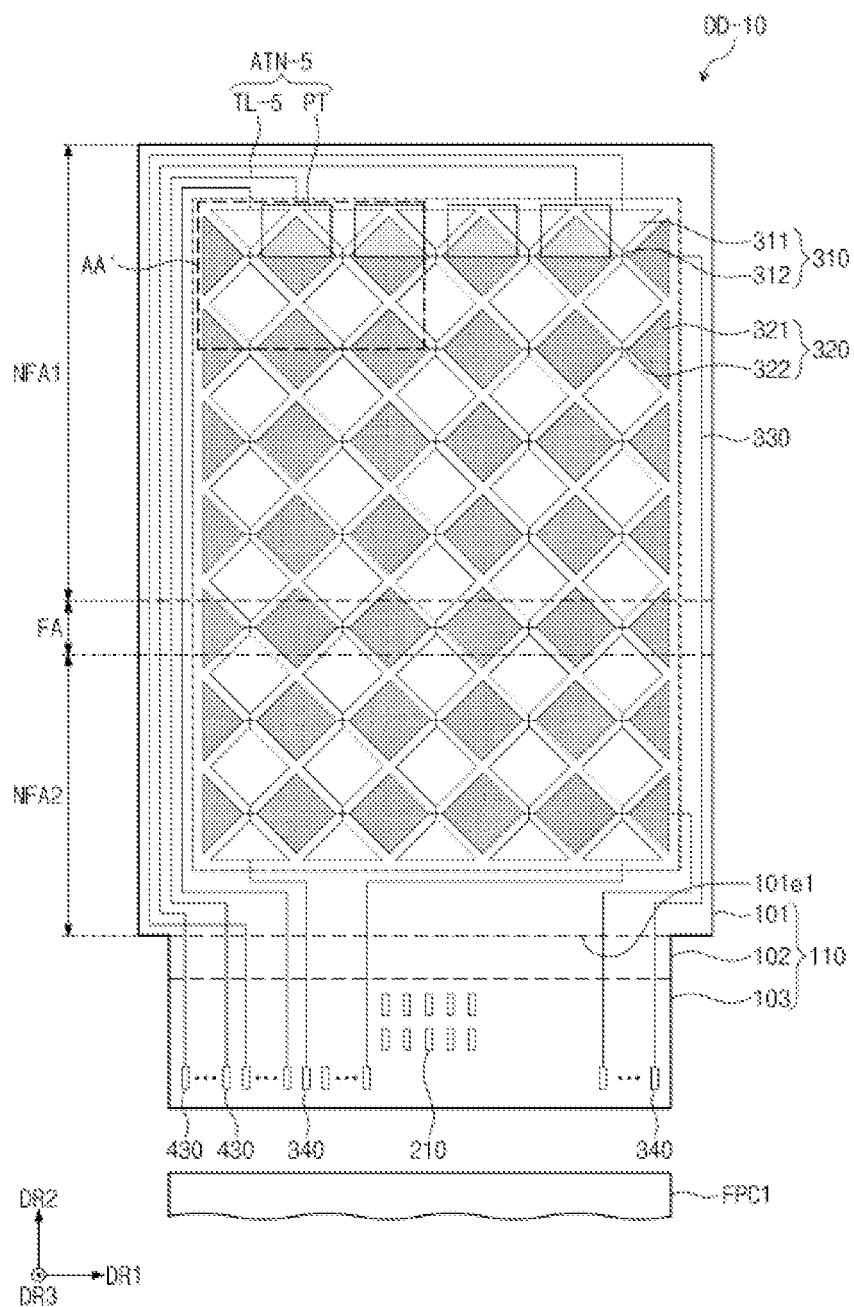
FIG. 21 is a plan view showing some components of a display device according to an embodiment.

FIG. 21 is a plan view showing some components of a display device DD-10 according to an embodiment.

Referring to FIG. 21, a base layer 110 may include a first base area 101, a second base area 102, and a third base area 103. The first base area 101 may overlap the light emitting area PXA and the non-light-emitting area NPXA shown in FIG. 9. The first base area 101 may overlap the display surface DS shown in FIG. 1.

The second base area 102 may extend from a first edge portion 101e1 of the first base area 101. The third base area 103 may extend from the second base area 102.

The second base area 102 may be bent toward a rear surface of the first base area 101 in a process of manufacturing the display device DD-10. Accordingly, the third base area 103 may be disposed at a rear side of the first base area 101 in the display device DD shown in FIG. 1.

The sensor layer ISL shown in FIG. 9 may obtain information about the external input based on a variation in mutual capacitance or a variation in self-capacitance. The sensor layer ISL may include a plurality of first sensing electrodes 310, a plurality of second sensing electrodes 320, a plurality of sensing lines 330, and a plurality of sensing pads 340. Each of the first and second sensing electrodes 310 and 320 may include patterns included in the first conductive layer 160 (shown in FIG. 9) and/or the second conductive layer 180 (shown in FIG. 9).

The first sensing electrodes 310 and the second sensing electrodes 320 may overlap the display surface DS. The sensor layer ISL may obtain the information about the external input based on the variation in mutual capacitance between the first sensing electrodes 310 and the second sensing electrodes 320.

The first sensing electrodes 310 may be arranged in the second direction DR2 and may be spaced apart from each other in the second direction DR2. Each of the first sensing electrodes 310 may extend in the first direction DR1. The second sensing electrodes 320 may be arranged in the first direction DR1 and may be spaced apart from each other in the first direction DR1. Each of the second sensing electrodes 320 may extend in the second direction DR2.

Each of the first sensing electrodes 310 may include sensing patterns 311 (or sensing members 311) and bridge patterns 312 (or bridge members 312) electrically connecting adjacent sensing patterns 311.

The sensing patterns 311 may be disposed directly on a layer/plane different from a layer/plane directly on which the bridge pattern 312 is disposed. When the bridge pattern 312 is included in the first conductive layer 160, the sensing patterns 311 may be included in the second conductive layer 180. When the bridge pattern 312 is included in the second conductive layer 180, the sensing patterns 311 may be included in the first conductive layer 160.

Each of the second sensing electrodes 320 may include sensing portions 321 and connection portions 322 electrically connecting adjacent sensing portions 321.

The sensing portions 321 may be connected to and provided integrally with the connection portions 322. The connection portions 322 may cross the bridge patterns 312. The sensing portions 321 and the connection portions 322 may be disposed directly on the same layer, and the sensing portions 321 and the connection portions 322 may be disposed directly on the same layer as the sensing patterns 311.

Each of the first sensing electrodes 310 and the second sensing electrodes 320 may be electrically connected to at least one of the sensing lines 330. One first sensing electrode 310 may be connected to two sensing lines 330. One end of the first sensing electrode 310 may be electrically connected to one sensing line 330, and the other end of the first sensing electrode 310 may be electrically connected to another sensing line 330. One second sensing electrode 320 may be electrically connected to one sensing line 330.

The sensing pads 340 may be electrically connected to the sensing lines 330, respectively. The sensing pads 340 may be disposed in the third base area 103.

One or more antennas ATN-5 may be provided. FIG. 21 shows four antennas ATN-5 as an example. The number of the antennas ATN-5 included in the display device DD-10 may be greater or less than four.

Each of the antennas ATN-5 may include an antenna pattern PT and a transmission line TL-5. The antenna patterns PT may be included in the second conductive layer 180 (shown in FIG. 9). The antenna patterns PT may overlap the exposed area EA (shown in FIG. 1).

The transmission lines TL-5 may be electrically connected to the antenna patterns PT. Antenna pads 430 may be electrically connected to the transmission lines TL-5, respectively. The antenna pads 430 may be disposed in the third base area 103.

Driving chip pads 210 may be disposed in the third base area 103. The driving chip pads 210 may be electrically connected to the driving chip. The driving chip may be mounted on the base layer 110. The driving chip pads 210 may be optional. Pads electrically connected to a film that supports the driving chip may be provided.

A first circuit film FPC1 may be attached to the third base area 103. The first circuit film FPC1 may be electrically connected to one or more of the first non-folding area NFA1, the second non-folding area NFA2, the folding area FA, and the antenna ATN-5 and may apply signals to the elements NFA1, NFA2, FA, and/or ATN-5. The first circuit film FPC1 may be bent toward the rear surface of the first non-folding area NFA1 and/or second non-folding area NFA2.

Figure 22:
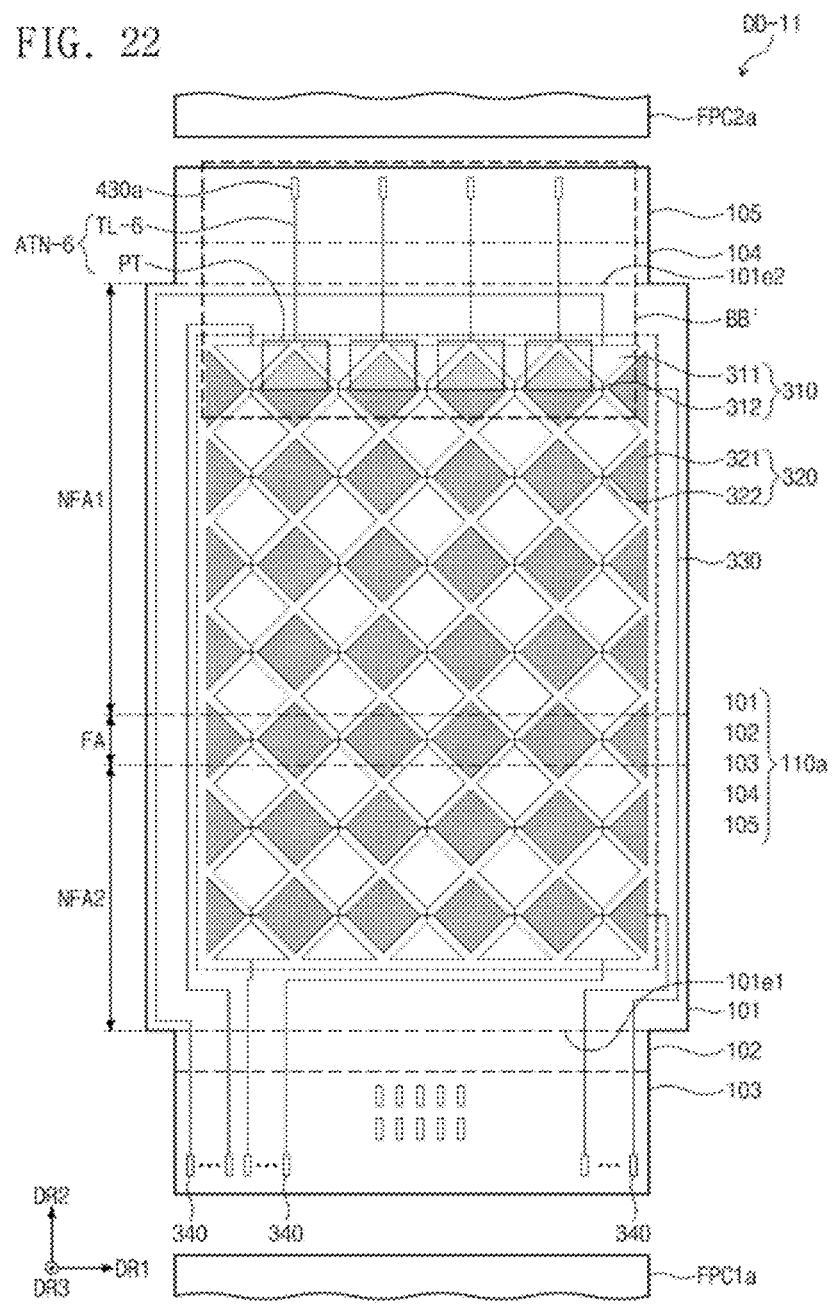
FIG. 22 is a plan view showing some components of a display device according to an embodiment.

FIG. 22 is a plan view showing some components of a display device DD-11 according to an embodiment. In FIG. 22, different features from those of FIG. 21 will be mainly described. In FIG. 22, the same reference numerals may denote the same elements in FIG. 21.

Referring to FIG. 22, a base layer 110a may include a first base area 101, a second base area 102, a third base area 103, a fourth base area 104, and a fifth base area 105. The first base area 101 may overlap the light emitting area PXA and the non-light-emitting area NPXA shown in FIG. 9.

The second base area 102 may extend from a first edge portion 101e1 of the first base area 101. The third base area 103 may extend from the second base area 102. The fourth base area 104 may extend from a second edge portion 101e2 of the first base area 101. The fifth base area 105 may extend from the fourth base area 104.

Each of the second base area 102 and the fourth base area 104 may be referred to as a bending area and may be bent toward a rear surface of the first base area 101 in the process of manufacturing the display device DD-11.

FIG. 22 shows a structure in which the first edge portion 101e1 and the second edge portion 101e2 extend in the second direction DR2 and are spaced apart from each other in the first direction DR1as an example. The first edge portion 101e1 may correspond to an edge of the first base area 101 that extends in the second direction DR2, and the second edge portion 101e2 may correspond to another edge of the first base area 101 that extends in the second direction DR2.

A plurality of antennas ATN-6 (including a plurality of transmission lines TL-6 and a plurality of antenna patterns PT), and a plurality of antenna pads 430a may be disposed on the base layer 110a.

The transmission lines TL-6 may be electrically connected to the antenna patterns PT, respectively. The antenna pads 430a may be electrically connected to the transmission lines TL-6, respectively. The antenna pads 430a may be disposed in the fifth base area 105. Accordingly, the antenna pads 430a and sensing pads 340 may be disposed in different base areas and may be substantially spaced from each other.

A first circuit film FPC1a may be attached to the third base area 103, and a second circuit film FPC2a may be attached to the fifth base area 105. The first circuit film FPC1a may be electrically connected to a display panel DP. The second circuit film FPC2a may be electrically connected to the antennas ATN-6. The first circuit film FPC1a and the second circuit film FPC2a may be bent toward the rear surface of the display panel DP.

The second circuit film FPC2a applying signals to the antennas ATN-6 may be disposed adjacent to the antennas ATN-6. Accordingly, the transmission lines TL-6 may be short, such that loss or attenuation of signals transmitted by the transmission lines TL-6 may be minimized.

Figure 23:
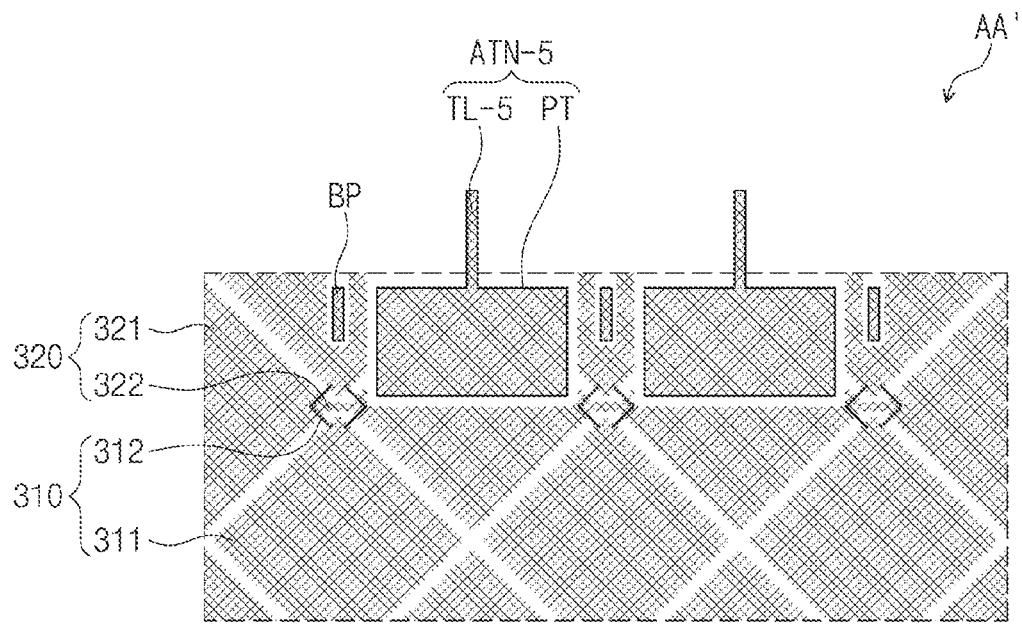
FIG. 23 is a plan view showing an area AA' shown in FIG. 21 according to an embodiment.
Figure 23:
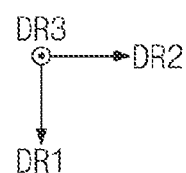

FIG. 23 is a plan view showing an area AA' shown in FIG. 21 according to an embodiment.

Referring to FIG. 23, the sensing patterns 311, the sensing portions 321, the connection portions 322, the antenna pattern PT, and auxiliary patterns BP may be disposed directly on the same layer/plane.

A portion of the sensing patterns 311 and a portion of the sensing portions 321 may be removed to provide spaces for accommodating the antenna patterns PT.

The auxiliary patterns BP may compensate for the sensitivity of touch sensors around the antennas ATN-5. The auxiliary patterns BP may have a mesh structure, and may be included in the second conductive layer 180.

An auxiliary pattern BP may sense an external touch by a self-capacitance method or a mutual capacitance method. The auxiliary pattern BP may sense a variation in the self-capacitance to sense the external input. An auxiliary pattern BP may be electrically connected to one or more of the second sensing electrodes 320 and may form the mutual capacitance with the corresponding sensing pattern(s) 311 surrounding the auxiliary pattern BP. The external input may be sensed based on a variation in capacitance between the auxiliary pattern BP and the surrounding sensing pattern(s) 311.

Figure 24:
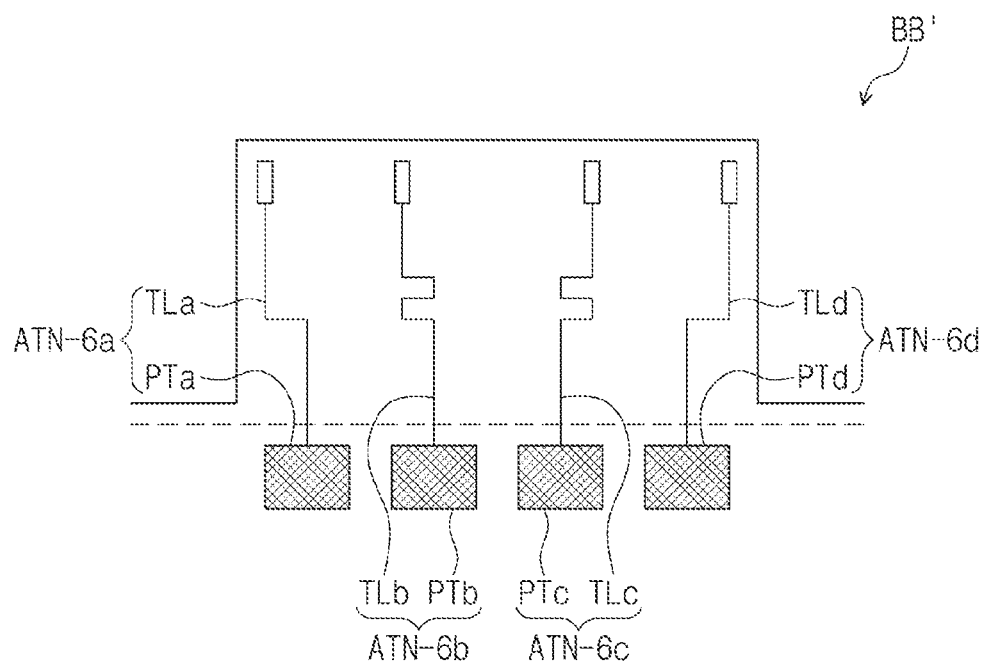
FIG. 24 is a plan view showing an area corresponding to an area BB' shown in FIG. 22 according to an embodiment.

FIG. 24 is a plan view showing an area corresponding to an area BB' shown in FIG. 22 according to embodiments.

Referring to FIG. 24, the display device DD-11 may include the antennas ATN-6. The antennas ATN-6 may be driven independently from each other for the beam forming. The antennas ATN-6 may include first, second, third, and fourth antennas ATN-6a, ATN-6b, ATN-6c, and ATN-6d. The first, second, third, and fourth antennas ATN-6a, ATN-6b, ATN-6c, and ATN-6d may include first, second, third, and fourth antenna patterns PTa, PTb, PTc, and PTd, respectively, and first, second, third, and fourth transmission lines TLa, TLb, TLc, and TLd, respectively.

The first antenna pattern PTa may be connected to the first transmission line TLa, the second antenna pattern PTb may be connected to the second transmission line TLb, the third antenna pattern PTc may be connected to the third transmission line TLc, and the fourth antenna pattern PTd may be connected to the fourth transmission line TLd.

A phase of signals may be changed depending on the length of the transmission line. Accordingly, the first, second, third, and fourth transmission lines TLa, TLb, TLc, and TLd may be designed to have substantially the same length such that the signals have the same change in phase. The second and third transmission lines TLb and TLc may have a zigzag structure to have substantially the same length as that of the first and fourth transmission lines TLa and TLd. FIG. 24 shows a structure in which the first and fourth transmission lines TLa and TLd are mirror images, and the second and third transmission lines TLb and TLc are mirror images. The first, second, third, and fourth transmission lines TLa, TLb, TLc, and TLd may or may not be symmetrical with reference to a center line of the area BB'.

Although examples of embodiments have been described, practical embodiments are not limited to these described embodiments. Various changes and modifications can be made to the described embodiments and may be within the scope of the attached claims.

What is claimed is:

1. A display device comprising:
a display layer comprising a first display area including an exposed area and a cover area, a folding display area adjacent to the first display area, and a second display area adjacent to the display folding area;
a sensor layer disposed on the display layer; and
an antenna provided in the sensor layer and overlapping the exposed area of the first display area on a plane,
wherein the second display area covers the cover area of the first display area and exposes the exposed area of the first display area, when the folding display area is folded,
wherein the sensor layer comprises:
a first conductive layer disposed on the display layer;
an insulating layer disposed on the first conductive layer; and
a second conductive layer disposed on the insulating layer, and the antenna comprises an antenna pattern disposed on the same layer as the second conductive layer.

2. The display device of claim 1, wherein the antenna further comprises a ground pattern disposed on the same layer as the first conductive layer and grounded, and the ground pattern has a size greater than a size of the antenna pattern.

3. The display device of claim 1, wherein the second conductive layer of the sensor layer comprises an auxiliary pattern disposed adjacent to the antenna pattern and configured to sense an external input.

4. The display device of claim 1, wherein the display layer comprises:
a first electrode;
a light emitting layer disposed on the first electrode; and
a second electrode disposed on the light emitting layer, and spaced from the antenna pattern in a plan view of the display device.

5. The display device of claim 4, wherein the second electrode includes an opening, wherein the antenna pattern is at least partially disposed inside the opening in the plan view of the display device.

6. A display device comprising:
a display layer comprising a first display area including an exposed area and a cover area, a folding display area adjacent to the first display area, and a second display area adjacent to the display folding area;
a sensor layer disposed on the display layer;
an antenna provided in the sensor layer and overlapping the exposed area of the first display area on a plane,
wherein the second display area covers the cover area of the first display area and exposes the exposed area of the first display area, when the folding display area is folded;
a portion of the antenna disposed on the sensor layer, wherein the sensor layer comprises:
a first conductive layer disposed on the display layer;
an insulating layer disposed on the first conductive layer; and
a second conductive layer disposed on the insulating layer,
the antenna comprises:
an antenna pattern disposed on the sensor layer; and
a transmission line disposed on the same layer as the first conductive layer or the second conductive layer, and the antenna pattern is indirectly fed through the transmission line.

7. A display device comprising:
a display layer comprising a first display area including an exposed area and a cover area, a folding display area adjacent to the first display area, and a second display area adjacent to the display folding area;
a sensor layer disposed on the display layer;
an antenna provided in the sensor layer and overlapping the exposed area of the first display area on a plane,
wherein the second display area covers the cover area of the first display area and exposes the exposed area of the first display area, when the folding display area is folded; and
an additional antenna, wherein each of the first display area and the second display area comprises a main display area and an auxiliary display surface bent from the main display area, and wherein the additional antenna is disposed on the auxiliary display surface.

8. The display device of claim 1, further comprising:
a first additional antenna overlapping the cover area of the first display area; and
a second additional antenna overlapping the second display area.

9. The display device of claim 1, wherein the first display area is longer than the second display area in a direction perpendicular to a folding axis of the display device.

* * * * *